(12) United States Patent
Lee

(10) Patent No.: US 11,348,639 B2
(45) Date of Patent: May 31, 2022

(54) NON-VOLATILE MEMORY DEVICE, STORAGE DEVICE HAVING THE SAME, AND READING METHOD THEREOF

(71) Applicant: SAMSUNG ELECTRONICS CO., LTD., Suwon-si (KR)

(72) Inventor: Kitaek Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 17/034,141

(22) Filed: Sep. 28, 2020

(65) Prior Publication Data

US 2021/0272627 A1 Sep. 2, 2021

(30) Foreign Application Priority Data

Mar. 2, 2020 (KR) .................. 10-2020-0025983

(51) Int. Cl.
  *G11C 11/00* (2006.01)
  *G11C 13/00* (2006.01)
  *H01L 27/24* (2006.01)

(52) U.S. Cl.
  CPC ........ *G11C 13/004* (2013.01); *G11C 13/0004* (2013.01); *G11C 13/0026* (2013.01); *G11C 13/0028* (2013.01); *G11C 13/0069* (2013.01); *H01L 27/2427* (2013.01); *H01L 27/2481* (2013.01)

(58) Field of Classification Search
  CPC ............. G11C 13/004; G11C 13/0004; G11C 13/0026; G11C 13/0028

USPC ......................................................... 365/163
See application file for complete search history.

(56) References Cited

U.S. PATENT DOCUMENTS

| | | | |
|---|---|---|---|
| 8,059,455 B2 | 11/2011 | Stern et al. | |
| 8,341,333 B2 | 12/2012 | Takada | |
| 9,251,900 B2 | 2/2016 | Sadashivappa | |
| 9,400,750 B2 | 7/2016 | Lee et al. | |
| 9,792,958 B1* | 10/2017 | Laurent | G11C 11/2253 |
| 11,023,310 B1* | 6/2021 | Grigoryan | G06F 11/1004 |
| 2009/0204824 A1 | 8/2009 | Lin et al. | |
| 2009/0323942 A1 | 12/2009 | Sharon et al. | |
| 2011/0069524 A1* | 3/2011 | Toba | G11C 13/004 |
| | | | 365/63 |
| 2015/0378890 A1 | 12/2015 | Lien et al. | |
| 2018/0019014 A1 | 1/2018 | Thomson et al. | |
| 2019/0377632 A1 | 12/2019 | Oh et al. | |

* cited by examiner

*Primary Examiner* — Vu A Le
(74) *Attorney, Agent, or Firm* — F. Chau & Associates, LLC

(57) ABSTRACT

A non-volatile memory device includes a memory cell array, a word line driver, a bit line driver, a read circuit, and control logic. The memory cell array includes a plurality of banks. Each bank includes a plurality of tiles. Each tile includes a plurality of resistive memory cells connected to a plurality of bit lines and a plurality of word lines. The word line driver selects one of the word lines in response to an input address. The bit line driver selects one of the bit lines in response to the input address. The read circuit reads a code word from the memory cell array in a read operation. The control logic is configured to control the word line driver, the bit line driver, the read circuit in the read operation. The control logic performs an address scramble on the input address, and provides the scrambled address to the read circuit to access the plurality of tiles in the read operation.

20 Claims, 37 Drawing Sheets

I-I'

NON-VOLATILE MEMORY DEVICE, STORAGE DEVICE HAVING THE SAME, AND READING METHOD THEREOF

CROSS-REFERENCE TO RELATED APPLICATION(S)

This U.S. provisional patent application claims benefit of priority under 35 U.S.C. 119(a) to Korean Patent Application No. 10-2020-0025983 filed on Mar. 2, 2020 in the Korean Intellectual Property Office, the disclosure of which is incorporated reference in its entirety herein.

TECHNICAL FIELD

Example embodiments of the present inventive concept relate to a non-volatile memory device, a storage device having the same, and a reading method thereof.

DISCUSSION OF RELATED ART

Phase change random access memory (PRAM) is a type of non-volatile memory that exploits the unique behavior of a phase change material such as a chalcogenide alloy to store data. A chalcogenide alloy may change into a crystalline state or an amorphous state after being heated and cooled. The phase change material has a low resistance in the crystalline state, and has a high resistance in the amorphous state. The crystalline state may represent a set or logic level 0 of the data, and the amorphous state may represent a reset or logic level 1 of the data.

SUMMARY

Example embodiments of the present inventive concept may provide a non-volatile memory device with an improved read margin, a storage device having the same, and a reading method thereof.

According to an exemplary embodiment of the present inventive concept, a non-volatile memory device includes a memory cell array, a word line driver, a bit line driver, a read circuit, and control logic. The memory cell array includes a plurality of banks having a plurality of tiles. Each of the plurality of tiles have a plurality of resistive memory cells connected to a plurality of bit lines and a plurality of word lines. The word line driver is configured to select one of the plurality of word lines in response to an input address. The bit line driver is configured to select one of the plurality of bit lines in response to the input address. The read circuit is configured to read a code word from the memory cell array in a read operation. The control logic is configured to control the word line driver, the bit line driver, and the read circuit in the read operation. The control logic performs an address scramble on the input address, and provides the scrambled address to the read circuit to access the plurality of tiles in the read operation.

According to an exemplary embodiment of the present inventive concept, a non-volatile memory device includes first and second tiles, wherein each of the first and second tiles includes first resistive memory cells formed on a first layer and connected between first word lines and a bit line; second resistive memory cells formed on a second layer disposed on the first layer, and connected between second word lines and the bit line; and a peripheral circuit disposed below the first layer, where each of the first word lines, the second word lines, and the bit line are connected to each other through at least one via, wherein each of the first and second tiles is driven according to an address scramble in a read operation.

According to an exemplary embodiment of the present inventive concept, a reading method of a non-volatile memory device includes determining a read level according to an address input in a read operation; performing a read operation using the determined read level to read data; performing an error correction operation on the read data to generate error-corrected data; and outputting the error-corrected data to an external device, wherein the read operation is performed by an address scramble according to a combination of different tiles, different word lines, or different bit lines.

According to an exemplary embodiment of the present inventive concept, a storage device includes at least one memory device; and a memory controller configured to control the at least one non-volatile memory device, wherein the at least one non-volatile memory device includes a memory cell array. The memory cell array includes a plurality of banks, wherein each of the plurality of banks includes a plurality of tiles. The plurality of tiles are driven according to an address scramble.

BRIEF DESCRIPTION OF DRAWINGS

The present inventive concept will be more clearly understood from the following detailed description, taken in conjunction with the accompanying drawings, in which.

DETAILED DESCRIPTION

Hereinafter, example embodiments of the present inventive concept will be described as follows with reference to the accompanying drawings.

In a non-volatile memory device and an operation method thereof according to an example embodiment, read margins of tiles of the non-volatile memory device may be equalized by applying an address scramble with respect to the tiles activated based on an address in a read operation. The address scramble may be configured by a combination of different tiles, different word lines or different bit lines which are not adjacent to each other in a read operation. Accordingly, the number of error bits may decrease when a word line bridge is generated. Accordingly, a read margin and a yield may improve.

Figure 1:
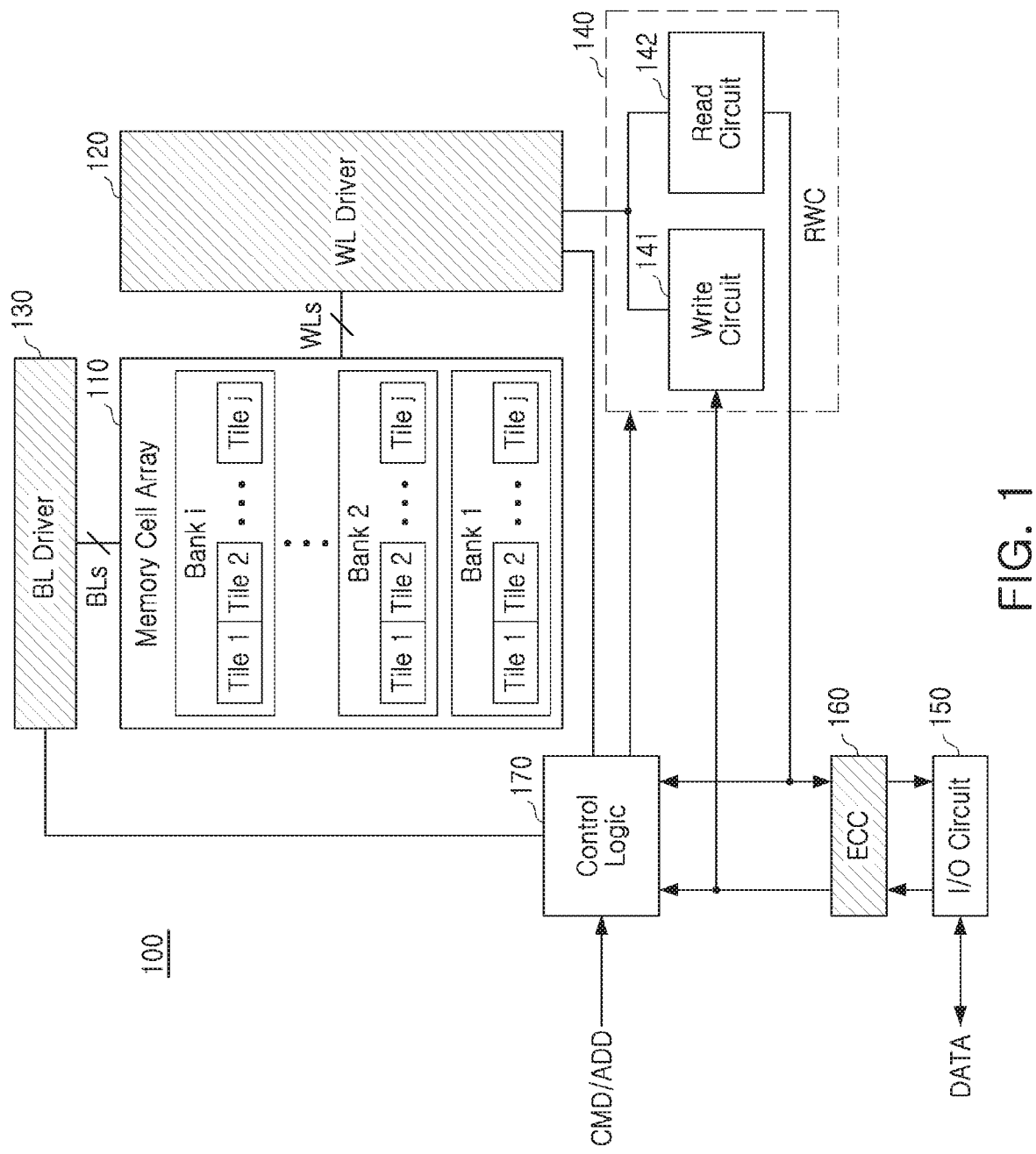
FIG. 1 is a diagram illustrating a non-volatile memory device 100 according to an example embodiment of the present disclosure.

FIG. 1 is a diagram illustrating a non-volatile memory device 100 according to an example embodiment of the inventive concept. Referring to FIG. 1, the non-volatile memory device 100 includes a memory cell array 110, a word line driver 120 (e.g., a driver circuit), a bit line driver 130 (e.g., a driver circuit), a read and write circuit (RWC) 140, a data input and output (I/O) circuit 150, an error correction circuit (ECC) 160, and a control logic 170 (e.g., a logic circuit).

The memory cell array 110 may be connected to the word line driver 120 through a plurality of word lines WLs and may be connected to the bit line driver 130 through a plurality of bit lines BLs.

The memory cell array 110 may include a plurality of banks (Bank 1 to Bank i; where i is an integer equal to higher than 2). Each of the plurality of banks may include a plurality of tiles (Tile 1 to Tile j; where j is an integer equal to higher than 2). Each of the plurality of tiles may include a plurality of memory cells connected to the plurality of word lines WLs and the plurality of bit lines BLs. Each of the plurality of memory cells may be connected between a word line and a bit line. A memory cell may store at least one bit using a resistance material. In an exemplary embodiment, each of the tiles is capable of storing a same amount of data or includes a same number of memory cells.

In an example embodiment, the plurality of tiles may be driven according to an address scramble in a read operation. Accordingly, the plurality of tiles may include memory cells configured to receive the same address according to an address scramble and to be activated in different positions. The address scramble may be configured by a combination of different tiles, different word lines, or different bit lines.

The word line driver 120 may be connected to the memory cell array 110 through the word lines WLs. The word line driver 120 may include at least one row decoder (e.g., one or more row decoding circuits). A peripheral circuit may include the at least one row decoder. The row decoder may select one of the word lines using a row address according to a control of the control logic 170. For example, the row decoder may select one of the word lines using a row address in response to a control signal from the control logic 170. The word line driver 120 may apply a word line voltage to the selected word line. The word line voltage may include a read word line voltage, a write word line voltage, and the like. Although not illustrated in FIG. 1, the word line driver 120 may include a voltage generator circuit configured to generate such word line voltages.

In an example embodiment, the word line driver 120 may select a word line to activate memory cells disposed in different positions in at least two of the plurality of tiles in response to the same address.

The bit line driver 130 may be connected to the memory cell array 110 through the bit lines BLs. The bit line driver 130 may include at least one column decoder (e.g., one or more column decoding circuits). The column decoder may select one of the bit lines using a column address according to control of the control logic 170. For example, the column decoder may select one of the bit lines using a column address in response to a control signal from the control logic 170. Also, the bit line driver 130 may apply a bit line voltage to the selected bit line. The bit line voltage may include a read voltage, a set bit line voltage, a reset bit line voltage, and the like. Although not illustrated in FIG. 1, the bit line driver 130 may include a voltage generator circuit for generating the bit line voltages.

In an example embodiment, the bit line driver 130 may select a bit line to activate memory cells disposed in different positions in at least two of the plurality of tiles in response to the same address.

A read and write circuit 140 may perform a read operation or a write operation on the memory cell array 110 according to control of the control logic 170. The read and write circuit 140 includes a write circuit 141 and a read circuit 142.

The write circuit 141 may be connected to the word line driver 120 and the bit line driver 130. The write circuit 141 may be implemented to perform a write operation (a set operation or a reset operation) on a memory cell connected to a selected bit line and a selected word line according to control of the control logic 170. For example, the write circuit 141 may apply a word line voltage to a selected word line in response to a write control signal of the control logic 170, and may apply a bit line voltage to a selected bit line. In an example embodiment, the write circuit 141 generates a set pulse or a reset pulse corresponding to data to be written in a write operation, and applies the generate pulse to a selected word line/bit line.

In an example embodiment, the write circuit 141 determines a write current according to resistance of a selected memory cell when writing data in the selected memory cell.

The read circuit 142 may be implemented to read data from a memory cell connected to a selected bit line and a selected word line according to control of the control logic 170. For example, the read circuit 142 may read data from a memory cell connected to a selected bit line and a selected word line in response to a read control signal of the control logic 170. In an example embodiment, the read circuit 142 may perform a sensing operation for sensing a voltage difference between a voltage of the selected word line/bit line and a reference voltage and distinguishing on/off cells from each other according to the sensed voltage difference.

In an example embodiment, the read and write circuit 140 are disposed below the word line driver 120 as illustrated in FIG. 1. However, in an alternate embodiment, the read and write circuit 140 may be disposed in a different location.

The data input and output circuit 150 may be implemented to transfer write data received from an external device (e.g., a memory controller) to data latches of the control logic 170 according to control of the control logic 170 in a write operation. Also, the data input and output circuit 150 may be implemented to output data read from the data latches to an external device (e.g., a memory controller) in a read operation. In an example embodiment, the data input and output circuit 150 may be implemented to input and output data to a sector unit. For example, the data input and output circuit 150 may be configured to input and output data in units of sectors.

The error correction circuit 160 may receive write data from the data input and output circuit 150 and may generate an error correction code (or a parity, a low density parity check (LDPC) code). Thereafter, a code word having the write data and the error correction code may be stored in a memory cell array corresponding to a write address.

Also, the error correction circuit 160 may correct an error in read data using an error correction code in a read operation. For example, a code word may be read from a memory cell array corresponding to a read address, and syndromes may be generated from the read code word. An error in the read code word may be corrected using the syndromes.

The control logic 170 may be implemented to control overall operations of the non-volatile memory device 100. The control logic 170 may control the word line driver 120, the bit line driver 130, the write circuit 141, the read circuit 142, the data input and output circuit 150, or the error correction circuit 160 in response to a command CMD, an address ADD, or control signals, input from an external entity. For example, the external entity may be a memory controller located outside the non-volatile memory device 100.

In an example embodiment, the control logic 170 selects one of a plurality of write modes and performs a write operation according to the selected write mode. In an example embodiment, the control logic 170 may generate a write control using the selected write mode, write data, or read data, or may generate a read control signal using the selected write mode or write data. In an example embodiment, in the plurality of write modes, a write operation may be performed using one of a normal mode, a data comparison write (DCW) mode, an aggressive data comparison write (aDCW) mode, and a read skip data comparison write (Read Skip aDCW) mode. The normal mode may be a mode in which a resistance drift is not reflected, the DCW mode may be a mode in which a resistance drift for a reset state is reflected, and the aDCW mode and the read skip aDCW may be modes in which both resistance drifts of a set state and a reset state are reflected.

A non-volatile memory device may merge bits of data corresponding to the same position in several tiles in response to an address, thereby configuring a sector (e.g., 64 bits). Then, process properties of tiles are the same. However, a problem may occur in a sector of a worst area (e.g., a near area or far area of a word line/bit line decoder) in a tile. For example, a memory cell that is near a decoder of the WL driver 120 may have more errors than a memory cell that is further away from the decoder. In another example, a memory cell that is far from a decoder of the WL driver 120 may have more errors than a memory cell that is closer to the decoder.

Instead, in the example embodiment, the non-volatile memory device 100 may, by applying an address scramble to tiles activated (or selected) in response to an address, be guaranteed the same level of read margin even when a read operation is performed at any address. Accordingly, a failure caused by combination of worst areas in a non-volatile memory device may be addressed. Also, a consumption ratio of an error correction code may decrease when a word line bridge or a bit line bridge is generated. As a result, a yield may improve.

Figure 2:
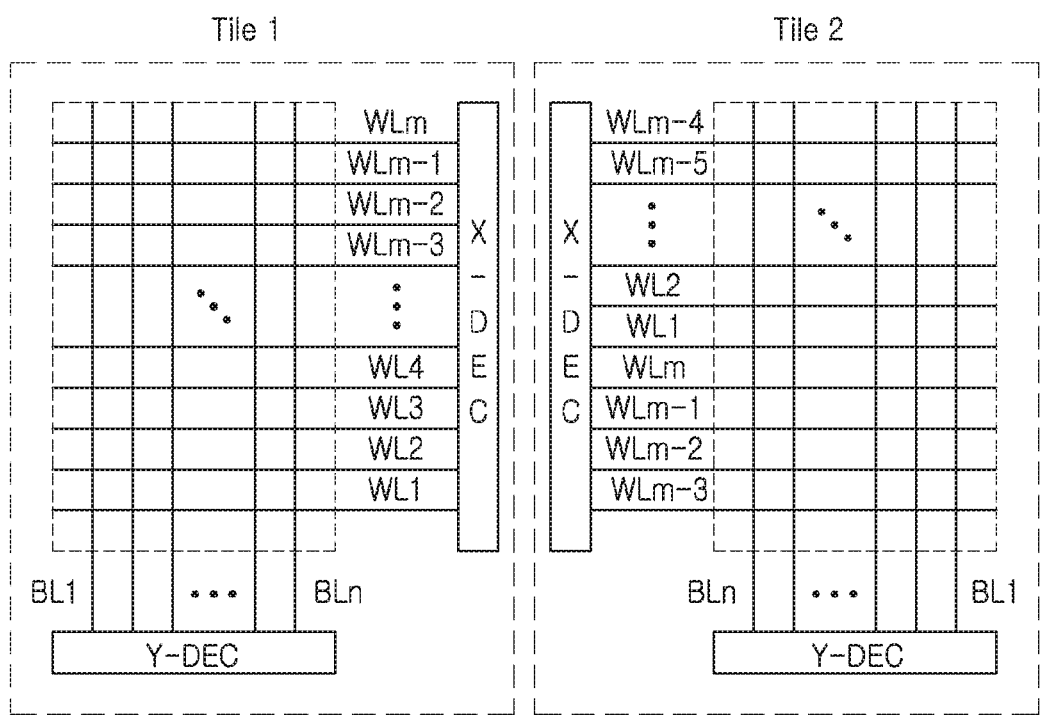
FIG. 2 is a diagram illustrating tiles (Tile 1 and Tile 2) adjacent to each other to which an address scramble is applied according to an example embodiment of the present disclosure.

FIG. 2 is a diagram illustrating tiles (Tile 1 and Tile 2) adjacent to each other to which an address scramble is applied according to an example embodiment of the inventive concept.

Referring to FIG. 2, a number of a word line in a first tile 1 may be assigned from a lowermost end of a cell array to an upper end (WL1 to WLm; where m is an integer equal to or greater than 2), and a number of a word line in a second tile Tile 2 may be assigned from a lowermost end, a fifth word line, to an upper end. For example, a row decoder X-DEC of the first tile Tile 1 may activate a first word line WL1 disposed on a lowermost end in response to a row address, and a row decoder X-DEC of the second tile Tile 2 may activate the fifth first word line WL1 disposed on a lowermost end in response to the same row address.

As illustrated in FIG. 2, the first tile Tile 1 may include first word line groups WL1 to WLm in which word line numbers are sequentially assigned in a first direction. The first direction may be a direction in which bit lines extend. Also, the second tile Tile 2 may include second word line groups WL1 to WLm−4 in which word line numbers are sequentially assigned from a predetermined position (e.g., from a lowermost end to the fifth word line as illustrated in FIG. 2) in the first direction, and remaining word line groups WLm−3 to WLm corresponding to remaining word line numbers sequentially assigned in the first direction. A predetermined position may be a random position of the sequentially assigned word lines. For example, the predetermined position may be a central portion of the sequentially assigned word lines.

As described above, an address scramble in the example embodiment may include a word line scramble. The word line scramble refers to the configuration in which physical positions of word lines activated in response to the same row address are different from each other. However, an example embodiment thereof is not limited thereto. The word line scramble illustrated in FIG. 2 is one possible example.

Referring back to FIG. 2, bit line numbers may be assigned (BL1 to BLn; where n is an integer equal to or greater than 2) from the left to the right in the first tile Tile 1, and in the second tile Tile 2, bit line numbers may be assigned from the right to the left.

As illustrated in FIG. 2, the first tile Tile 1 may include first bit line groups BL1 to BLn corresponding to bit line numbers sequentially assigned in a second direction. The second direction is a direction in which word lines extend. Also, the second tile Tile 2 may include second bit line groups BL1 to BLn corresponding to bit line numbers sequentially assigned in a direction opposite to the second direction.

The assigning of the bit line numbers of the tile in the example embodiment is not limited to the aforementioned example. The first tile Tile 1 may include first bit line groups BL1 to BLn corresponding to bit line numbers sequentially assigned in the second direction, and the second tile Tile 2 may include second bit line groups corresponding to bit line numbers sequentially assigned in the second direction from a predetermined position, and remaining bit line groups corresponding to remaining bit line numbers sequentially assigned in the second direction.

As described above, an address scramble in the example embodiment may include a bit line scramble. The bit line scramble refers to the configuration in which physical positions of bit lines activated (or selected) in response to the same column address are different from each other. However, an example embodiment thereof is not limited thereto. The bit line scramble illustrated in FIG. 2 is one possible example.

Figure 3:
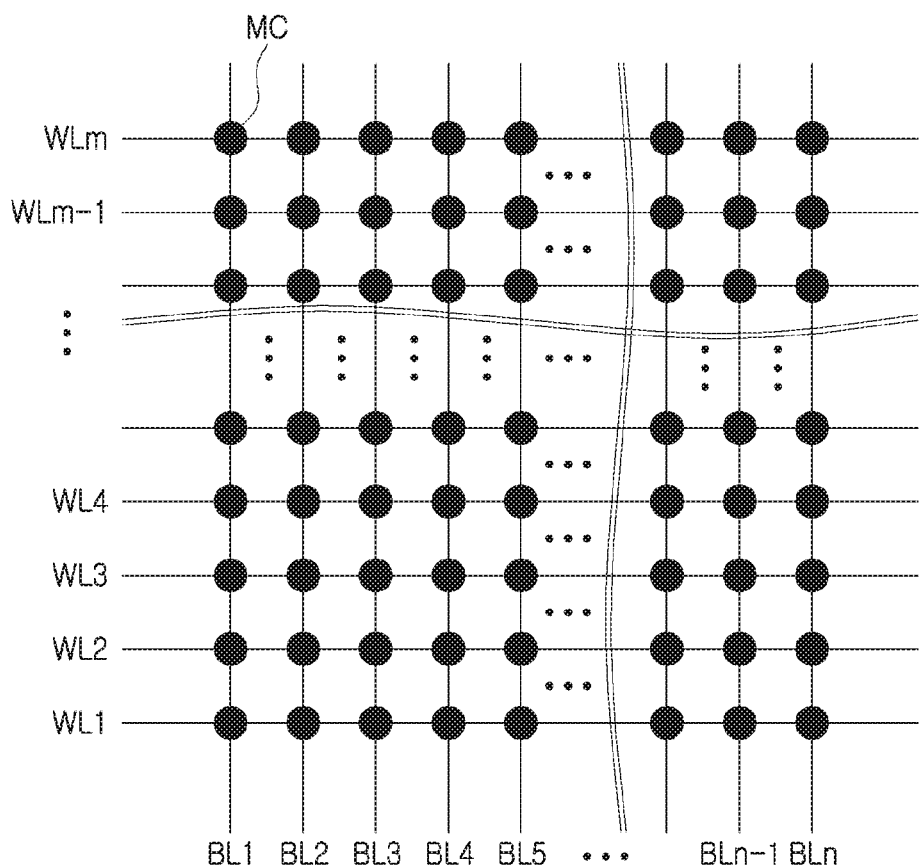
FIG. 3 is a diagram illustrating one of the tiles according to an example embodiment of the present disclosure.

FIG. 3 is a diagram illustrating one of the tiles according to an example embodiment of the inventive concept. Referring to FIG. 3, a tile may include a plurality of memory cells MC disposed in positions at which a plurality of word lines WL1 to WLm intersect with a plurality of bit lines BL1 to BLn.

In an example embodiment, each memory cell MC illustrated in FIG. 3 includes a variable resistor.

FIGS. 4A, 4B, 4C, and 4D are diagrams illustrating a memory cell according to an example embodiment of the inventive concept.

Figure 4A:
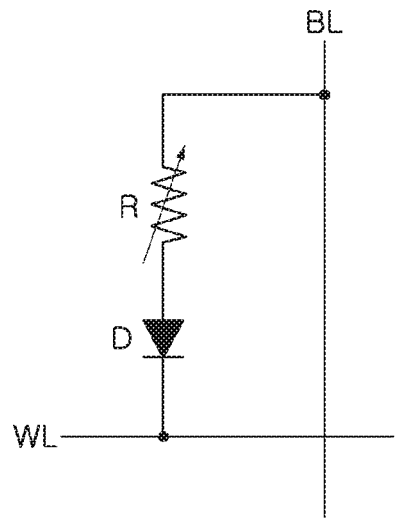
FIGS. 4A, 4B, 4C, and 4D are diagrams illustrating a memory cell according to an example embodiment of the present disclosure.

Referring to FIG. 4A, a memory cell MC includes a variable resistor R and a diode D. In an example embodiment, the variable resistor R is made from a phase change material. For example, the phase change material may include various types of materials such as GaSb, InSb, InSe, Sb2Te3, and GeTe formed by combining two elements, GeSbTe, GaSeTe, InSbTe, SnSb2Te4, and InSbGe formed by combining three elements, AgInSbTe, (GeSn)SbTe, GeSb (SeTe), and Te81Ge15Sb2S2 formed by combining four elements, or the like. In another example embodiment, the variable resistor R includes perovskite compounds, a transition metal oxide, magnetic materials, ferromagnetic materials, or antiferromagnetic materials, instead of a phase change material.

Figure 4B:
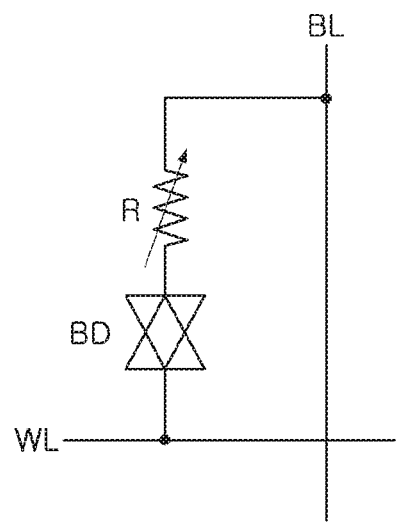

Referring to FIG. 4B, the memory cell MC include a variable resistor R and a bidirectional diode BD.

Figure 4C:
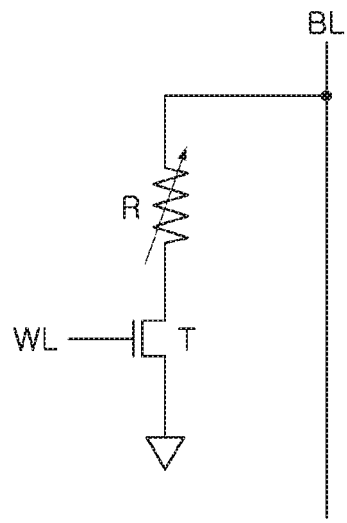

Referring to FIG. 4C, the memory cell MC includes a variable resistor R and a transistor T. A word line WL may be connected to a gate of the transistor T.

Figure 4D:
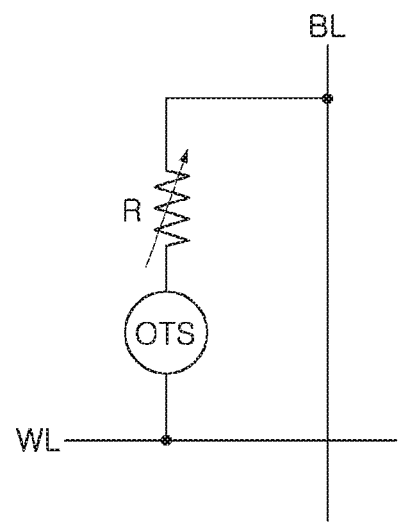

Referring to FIG. 4D, the memory cell MC includes an ovonic threshold switch (OTS) and a variable resistor R. The ovonic threshold switch (OTS) may include a material similar to germanium-antimony-telluride (GST; Ge2Sb2Te5). For example, the ovonic threshold switch (OTS) may include chalcogenide which may change to a crystalline state and a non-crystalline state. The chalcogenide may include a combination of selenium (Se), arsenic (As), germanium (Ge), and silicon (Si).

A structure of the memory cell MC is not limited to the examples illustrated in FIGS. 4A, 4B, 4C and 4D.

In the description below, an example of a three-dimensional structure of a memory cell configured as a switching device will be described.

FIGS. 5A, 5B, 5C, 5D, 5E, and 5F are diagrams illustrating a three-dimensional structure of a memory cell according to various example embodiments of the inventive concept.

Figure 5A:
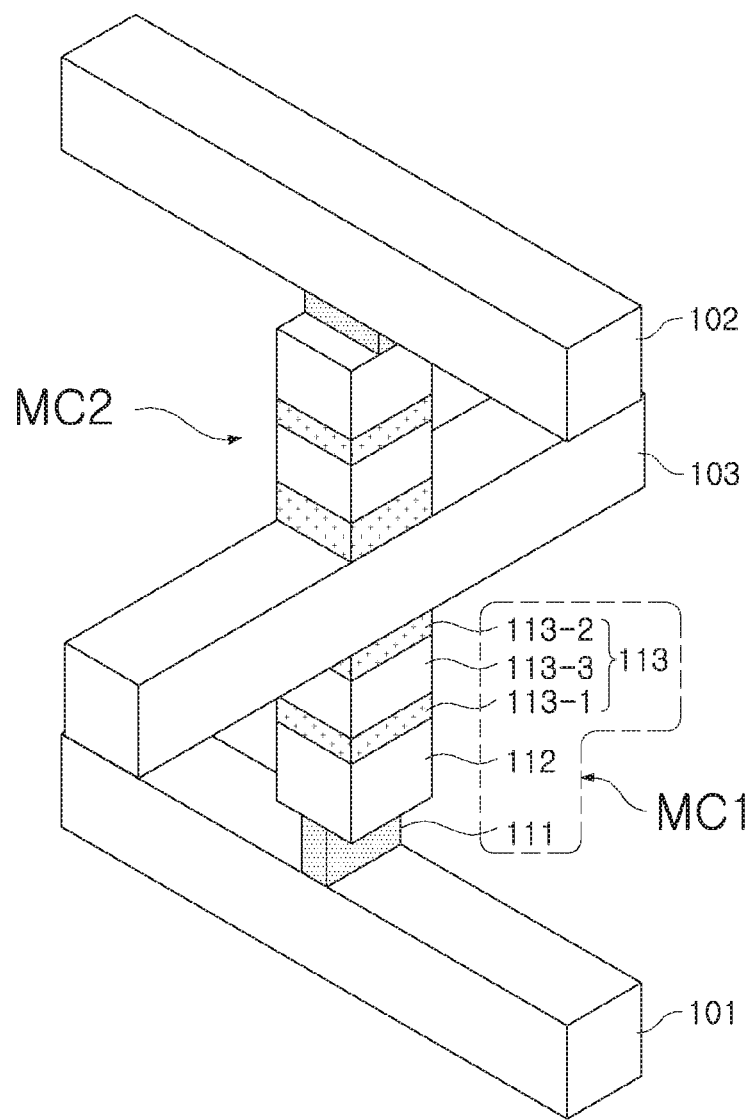
FIGS. 5A, 5B, 5C, 5D, 5E, and 5F are diagrams illustrating a three-dimensional structure of a memory cell according to an example embodiment of the present disclosure.

FIG. 5A illustrates a first memory cell MC1 and a second memory cell MC2 arranged among a plurality of conductive lines 101, 102, and 103. The first memory cell MC1 and the second memory cell MC2 may operate as independent memory cells. In the example embodiment, when a first conductive line 101 and a second conductive line 102 are word lines, a third conducive line 103 may be a bit line. When the first conductive line 101 and the second conductive line 102 are bit lines, the third conducive line 103 may be a word line. In the description below, the first conductive line 101 and the second conductive line 102 are referred to as a first word line and a second word line, respectively, for ease of description.

In the example embodiment, the first memory cell MC1 includes a first heating electrode 111, a first data storage device 112, and a first switch device 113. In the example embodiment, the first switch device 113 includes a first switch electrode 113-1, a second switch electrode 113-2, and a first select layer 113-3 disposed therebetween. In the example embodiment, the first select layer 113-3 may include an ovonic threshold switch (OTS) material. When a voltage greater than a threshold voltage is applied between the first switch electrode 113-1 and the second switch electrode 113-2, a current may flow through the first select layer 113-3. The first data storage device 112 may include a phase change material. In the example embodiment, the first data storage device 112 may include a chalcogenide material, for example. For example, the first data storage device 112 may include Ge—Sb—Te (GST). A crystallization temperature, a melting point, a phase change speed according to crystallization energy, and the like, of the first data storage device 112 may be determined depending on types of elements included in the first data storage device 112 and a chemical composition ratio thereof.

The second memory cell MC2 may be implemented to have a structure similar to the structure of the first memory cell MC1.

In the description below, a method of storing and erasing data will be described with reference to the first memory cell MC1. When a voltage is supplied through the first word line 101 and a bit line 103, a joule heat may be generated on an interfacial surface between the first heating electrode 111 and the first data storage device 112 according to a voltage. Due to the joule heat, a phase change material within the first data storage device 112 may change from a non-crystalline state to a crystalline state, or may change from a crystalline state to a non-crystalline state. The first data storage device 112 may have high resistance in a non-crystalline state, and may have low resistance in a crystalline state. In the example embodiment, data "0" or data "1" may be defined according to a resistance value of the first data storage device 112.

To store data in the first memory cell MC1, a program voltage may be supplied through the first word line 101 and the bit line 103. A program voltage may be greater than a threshold voltage of an ovonic threshold switch material included in the first switch device 113. Accordingly, a current may flow through the first switch device 113. Due to application of the program voltage, a phase change material included in the first data storage device 112 may change from a non-crystalline state to a crystalline state. Accordingly, data may be stored in the first memory area. In the example embodiment, when a phase change material included in the first data storage device 112 has a crystalline state, a state of the first memory cell MC1 may be referred to as a set state.

To remove (or erase) data stored in the first memory cell MC1, a phase change material included in the first data storage device 112 may be restored to a non-crystalline state from a crystalline state. For example, a predetermined erase voltage may be supplied through the first word line 101 and the bit line 103. Due to application of the erase voltage, the phase change material included in the first data storage device 112 may change from a crystalline state to a non-crystalline state. When the phase change material included in the first data storage device 112 has a non-crystalline state, a state of the first memory cell MC1 may be referred to as a reset state. In the example embodiment, a maximum value of the erase voltage may be greater than a maximum value of the program voltage. The time during which the erase voltage is applied may be shorter than the time during which the program voltage is applied.

In FIG. 5A, the first memory cell MC1 and the second memory cell MC2 may be implemented to have the same directivity. However, other embodiments of the memory cell are not limited thereto.

Figure 5B:
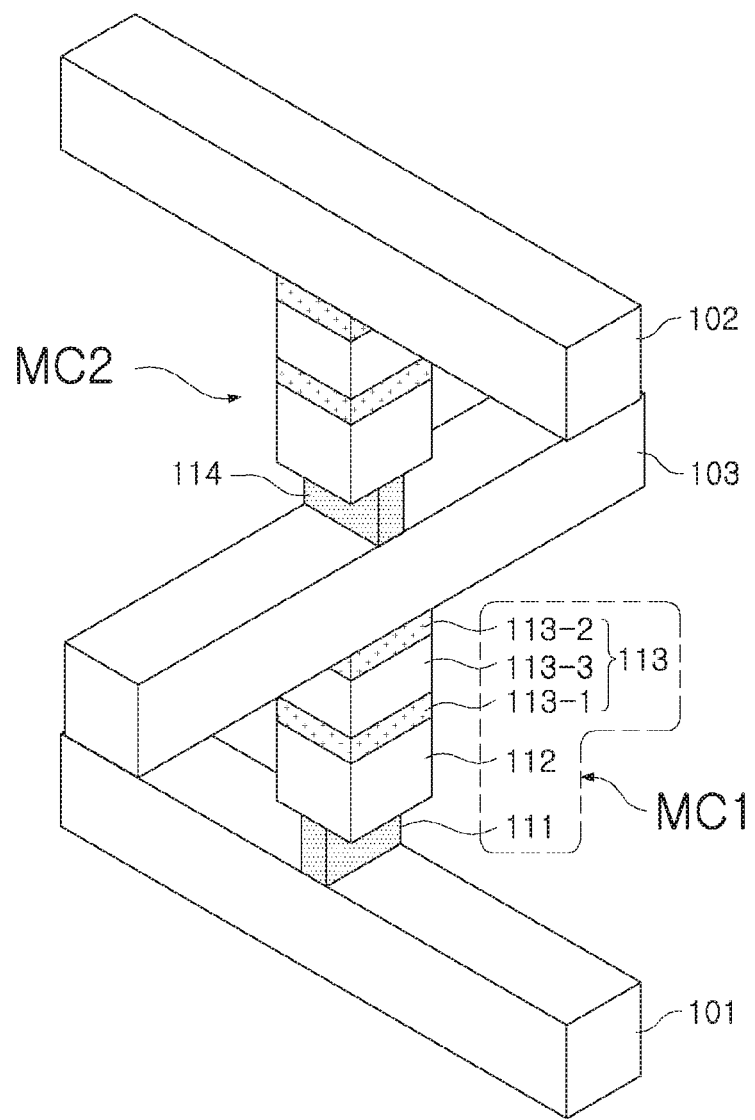

Referring to FIG. 5B, when the first conductive line 101 and the second conductive line 102 are the first word line and the second word line, respectively, as compared to the memory cell illustrated in FIG. 3A, directivities of the first memory cell MC1 and the second memory cell MC2 may be different from each other. For example, the heating electrode 111 of the first memory cell MC1 may be connected to the first word line 101, and a heating electrode 114 of the second memory cell MC2 may be connected to the bit line 103.

Each of the first memory cell MC1 and the second memory cell MC2 illustrated in FIG. 5A may have a first directivity. The first memory cell MC1 illustrated in FIG. 5B may have a second directivity, and the second memory cell MC2 may have a first directivity.

In FIGS. 5A and 5B, the first memory cell MC1 connected to the first word line formed on a first level and the second memory cell MC2 connected to the second word line formed on a second level may share a bit line. However, a structure of the memory cell in the example embodiment is not limited thereto.

Figure 5C:
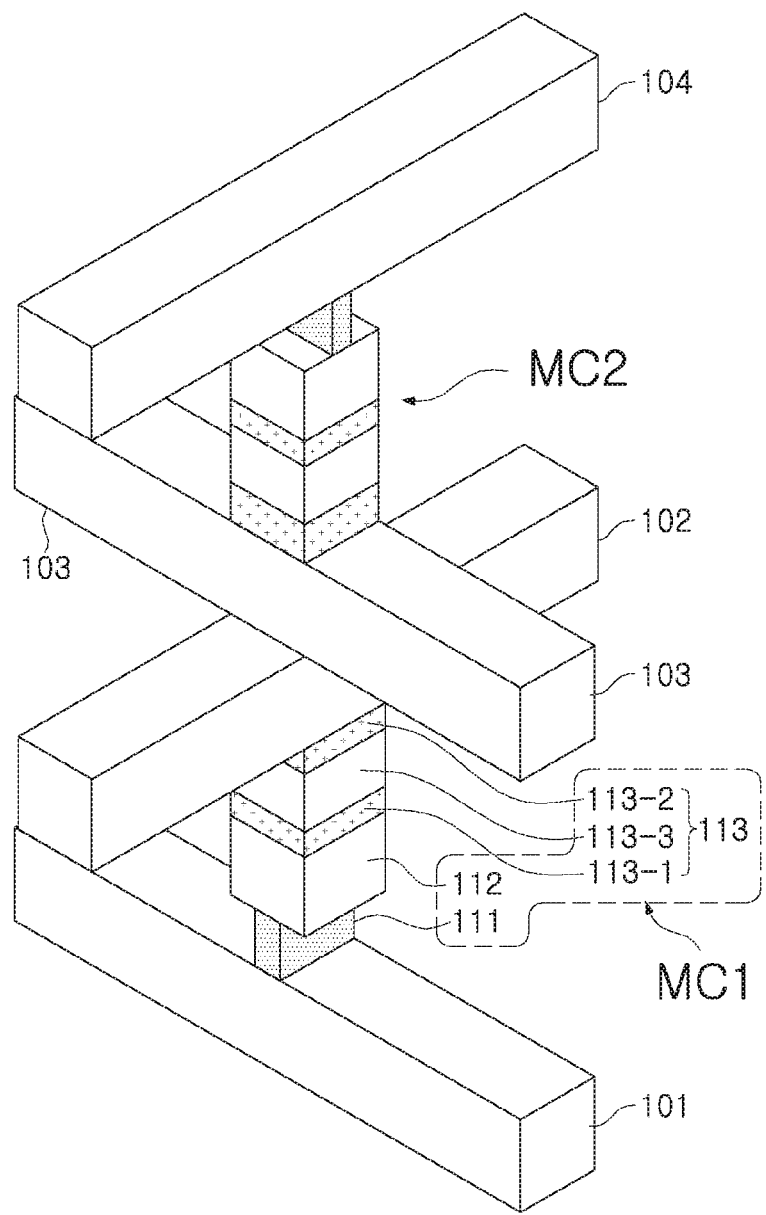

Referring to FIG. 5C, the first memory cell MC1 may be arranged at a point at which the first word line 101 formed on the first level intersects with the bit line 103 formed on the first level. The second memory cell MC2 may be arranged at a point at which a second word line 103 formed on a second level intersects with a second bit line 104 formed on the second level. The first memory cell MC1 may have a second directivity, and the second memory cell MC2 may have a first directivity.

Figure 5D:
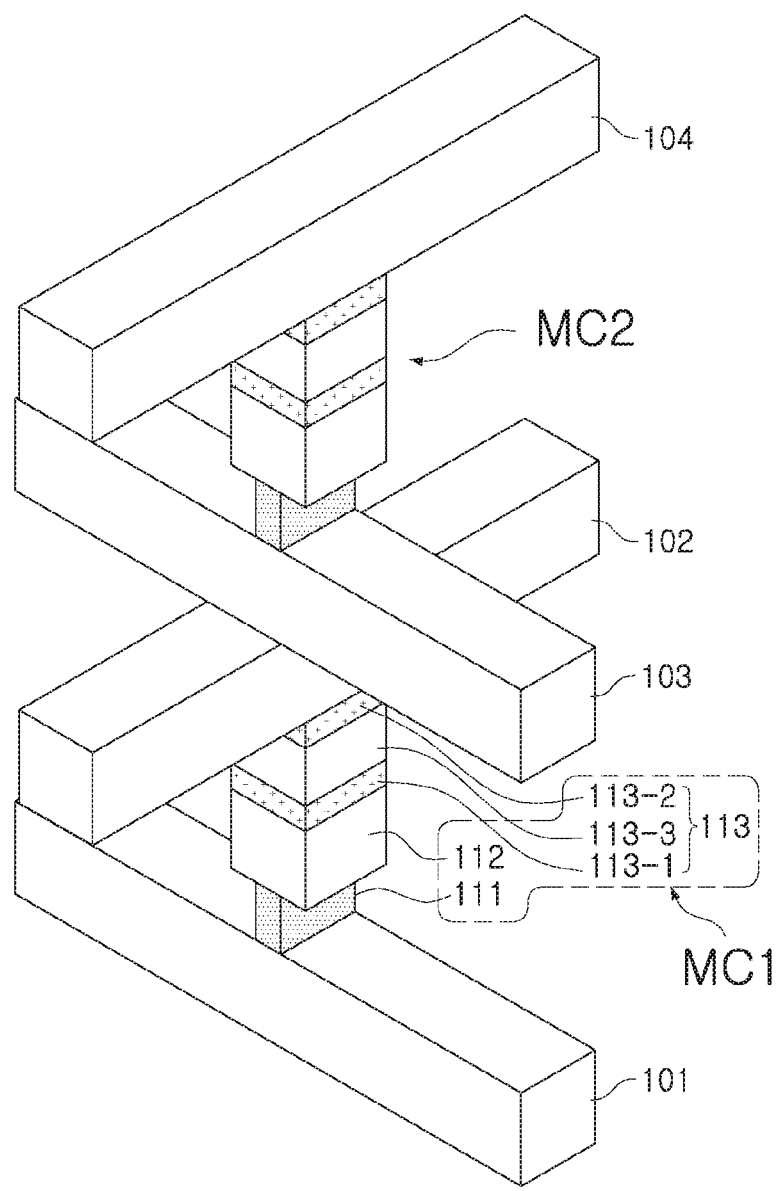

Referring to FIG. 5D, each of the first memory cell MC1 and the second memory cell MC2 may have a second directivity different from the memory cells illustrated in FIG. 5C.

The memory cell in the example embodiment do not include a heating electrode, and may be self-heated.

Figure 5E:
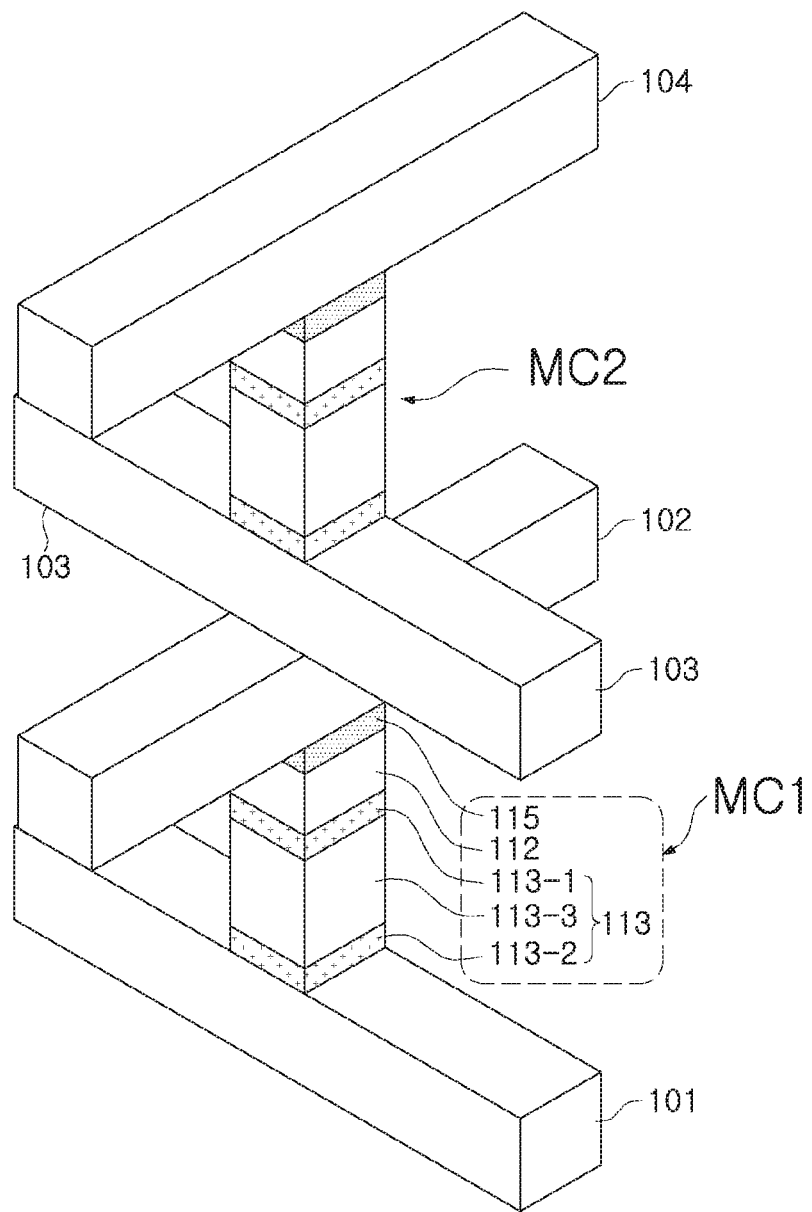
Figure 5F:
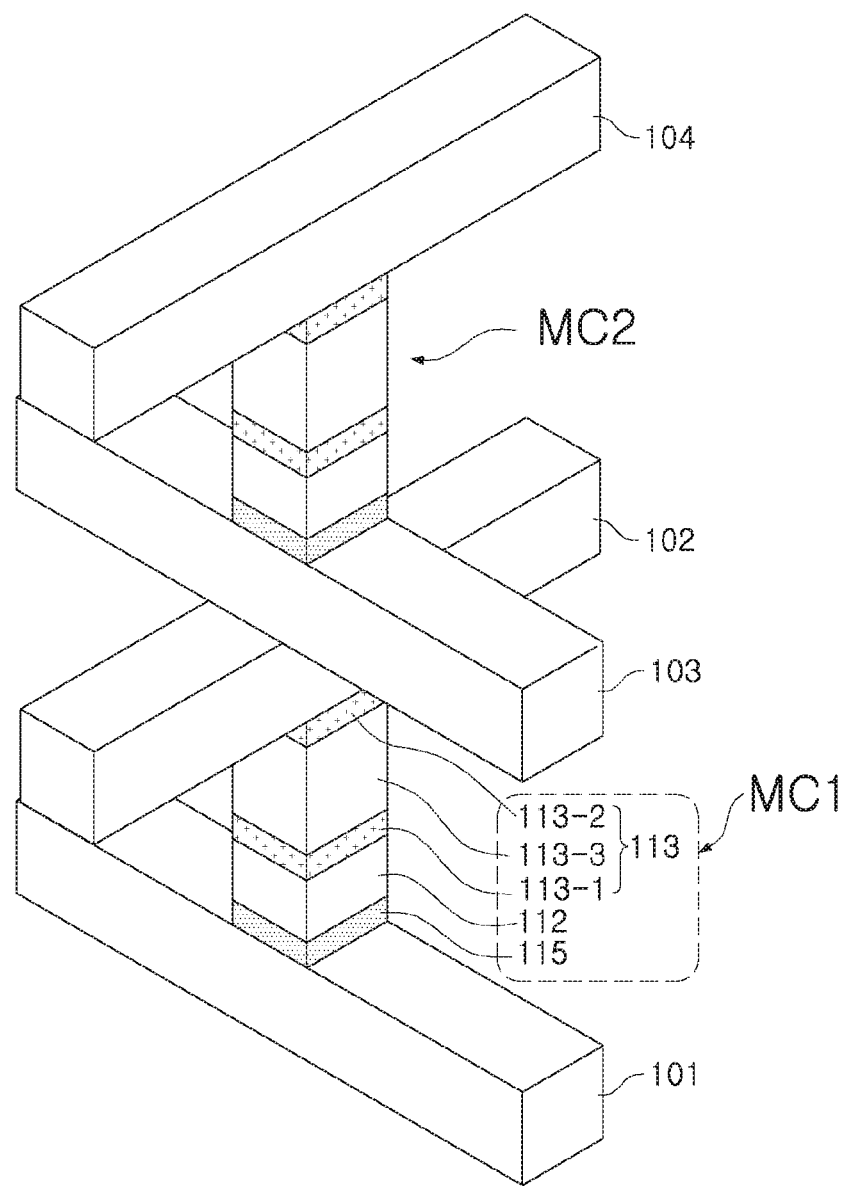

The memory cell illustrated in FIG. 5E has a structure in which a heating electrode is removed from the memory cell illustrated in FIG. 5C, and the memory cell illustrated in FIG. 5F has a structure in which a heating electrode is removed from the memory cell illustrated in FIG. 5D.

In an example embodiment, the memory cell array 110 has a three-dimensional stack structure.

Figure 6A:
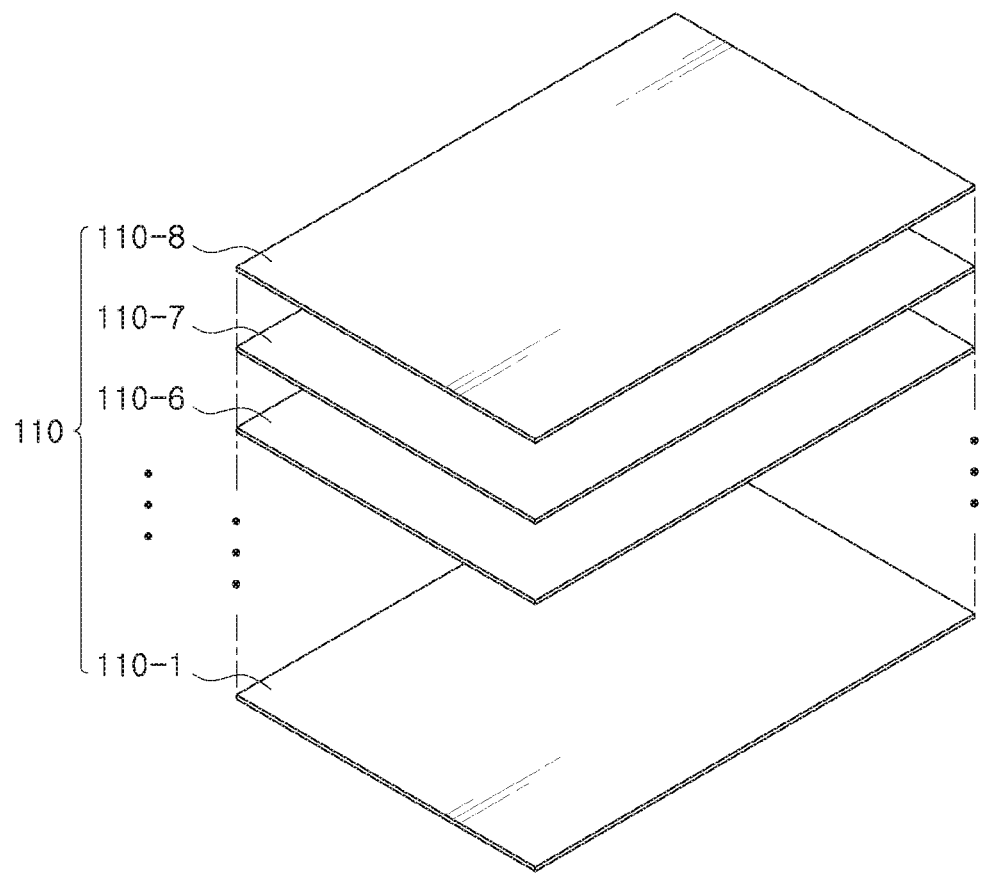
FIG. 6A is a diagram illustrating a three-dimensional stack structure of a memory cell array 110 according to an example embodiment of the present disclosure.

FIG. 6A is a diagram illustrating a three-dimensional stack structure of a memory cell array 110 according to an example embodiment of the inventive concept. The three-dimensional stack structure may refer to a stack structure in which a plurality of memory cell layers 110-1 to 110-8 are vertically stacked on a substrate.

FIG. 6A illustrates an example where eight memory cell layers 110-1 to 110-8 are stacked, but the number of layers is not limited thereto. Each of the memory cell layers 110-1 to 110-8 may include a plurality of resistive memory cell groups or a plurality of redundancy memory cell groups. When the memory cell array 110 has a three-dimensional stack structure, in the example embodiment, the plurality of memory cell layers 110-1 to 110-8 may have a cross point structure.

In the example embodiment, at least two of the plurality of memory cell layers 110-1 to 110-8 may perform a write operation according to different write modes. In the example embodiment, at least two of the plurality of memory cell layers 110-1 to 110-8 may perform a read operation according to different read levels.

Each of the layers illustrated in FIG. 6A may include a plurality of tiles.

Figure 6B:
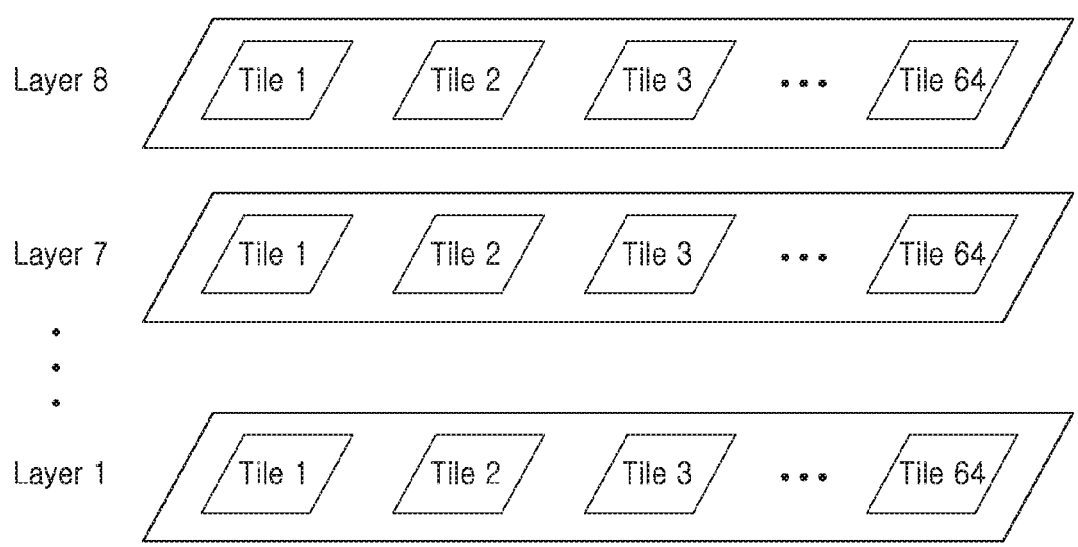
FIG. 6B is a diagram illustrating layers including a plurality of tiles.

FIG. 6B is a diagram illustrating layers including a plurality of tiles. Each of layers may include 64 tiles. However, the number of tiles included in each layer is not limited thereto.

The tiles illustrated in FIG. 6B may be formed on a single layer. However, an example embodiment of the tiles is not limited thereto. For example, the tiles may be formed on a plurality of layers in an example embodiment.

Figure 6C:
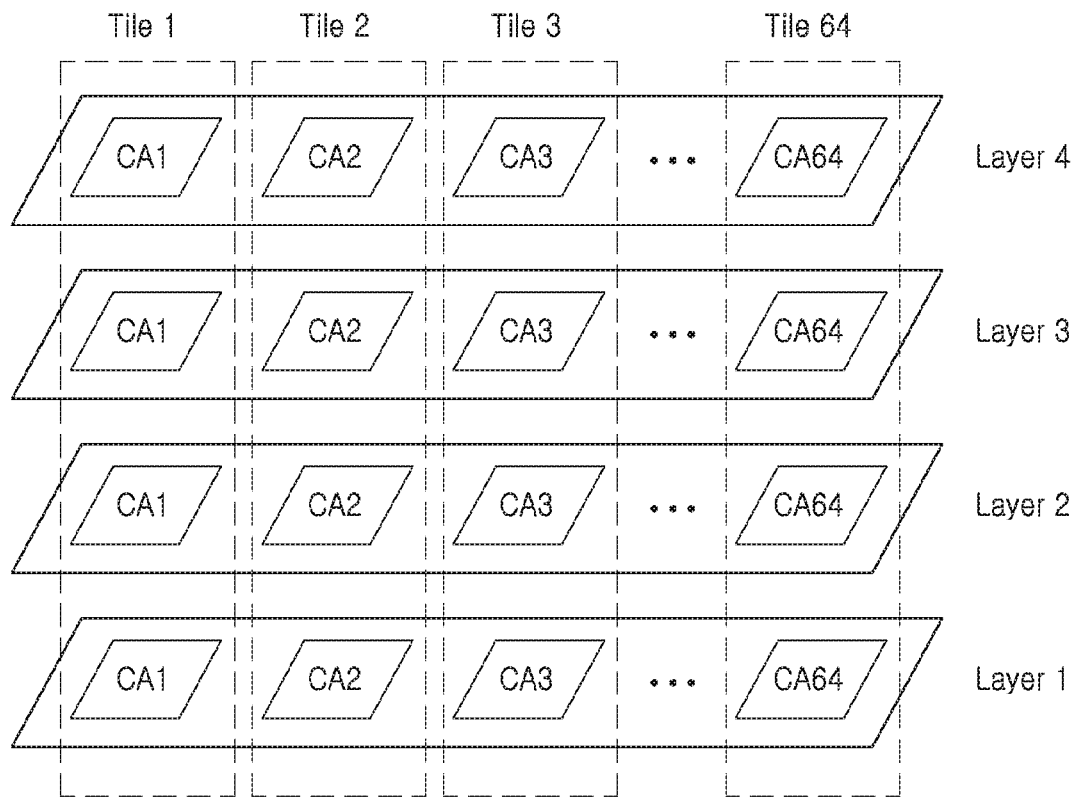
FIG. 6C is a diagram illustrating tiles formed in a plurality of layers.

FIG. 6C is a diagram illustrating a tile formed in a plurality of layers. Referring to FIG. 6C, a cell array CA1 of each of first to fourth layers may include a single tile. In FIG.

6C, cell arrays of four layers are configured as a single tile. However, the configuration of a tile is not limited thereto. FIG. 6C illustrates each layer including 64 cell arrays CA1 to CA64 as an example.

Figure 6D:
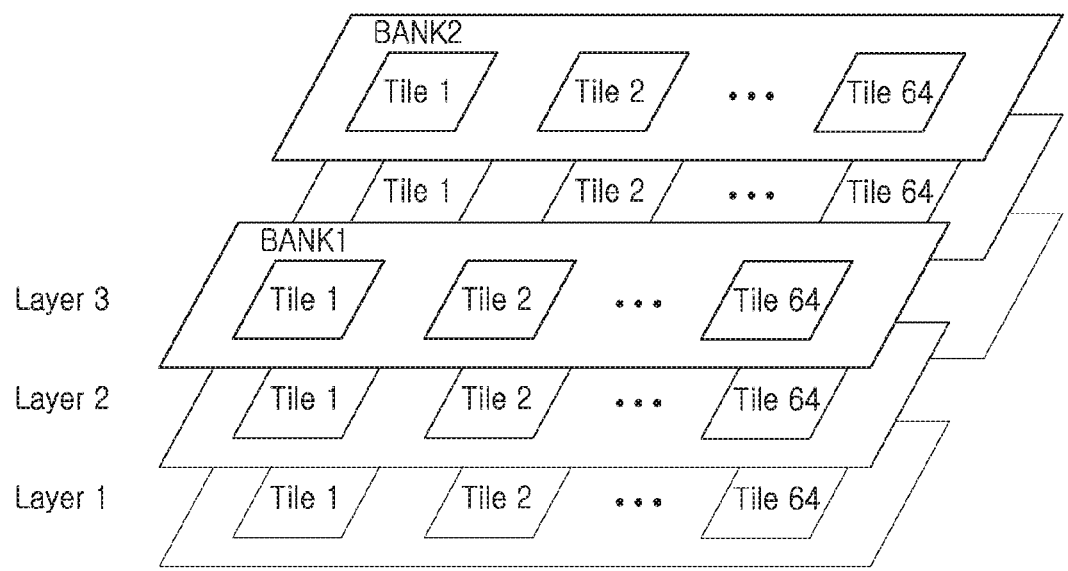
FIG. 6D is a diagram illustrating a plurality of banks having a plurality of tiles in a plurality of layers.

FIG. 6D is a diagram illustrating a plurality of banks having a plurality of tiles in a plurality of layers. Referring to FIG. 6D, each of three layers may include two banks, and each bank may include 64 tiles. However, the configurations of the bank, the tile, and the layer are not limited thereto.

Figure 7:
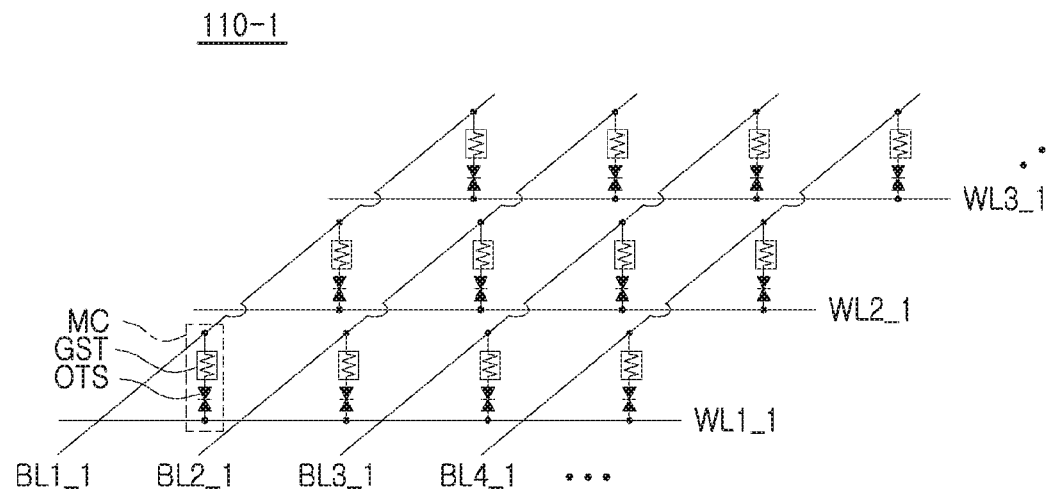
FIG. 7 is a diagram illustrating a single memory cell layer 110-1 illustrated in FIG. 6A according to an example embodiment of the present disclosure.

FIG. 7 is a diagram illustrating a single memory cell layer 110-1 illustrated in FIG. 6A according to an example embodiment of the inventive concept. Referring to FIG. 7, the memory cell layer 110-1 may include a cross point structure. The cross point structure may refer to a structure in which a single resistive memory cell MC is formed in an area in which one line intersects with the other line. For example, bit lines BL1_1 to BL4_1 may extend and be formed in the first direction, word lines WL1_1 to WL3_1 may extend and be formed in the second direction to intersect with the bit lines BL1_1 to BL4_1, and the resistive memory cell MC may be formed in an area in which the bit lines BL1_1 to BL4_1 intersects with the word lines WL1_1 to WL3_1, respectively.

In the example embodiment, the memory cell MC may be configured as a single-level cell SLC to store one bit. In another example embodiment, the memory cell MC may be configured as a multi-level cell MLC to store at least two or more bits of data. In another example embodiment, a portion of the memory cells MC are single-level cells and the other memory cells MC are multi-level cells MLC.

The memory cell array 110 in the example embodiment may include a cell array which performs a buffering function.

Figure 8:
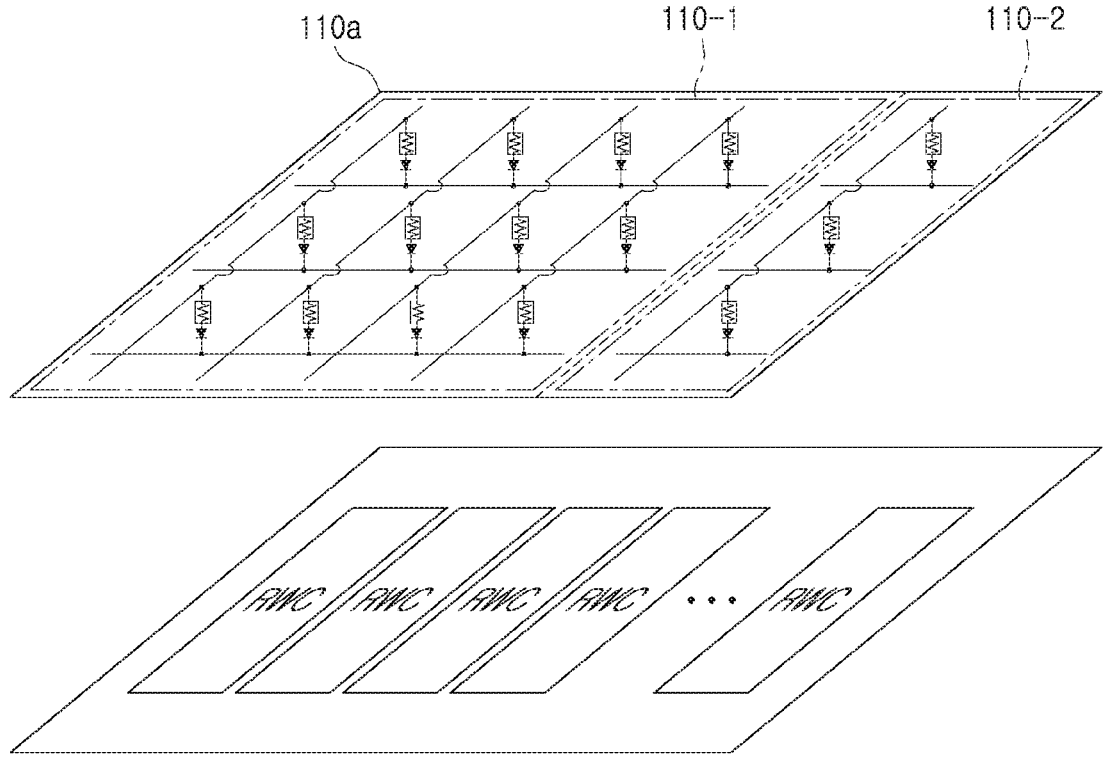
FIG. 8 is a diagram illustrating a memory cell array 110*a* according to another example embodiment of the present disclosure.

FIG. 8 is a diagram illustrating a memory cell array 110a according to an example embodiment of the inventive concept. Referring to FIG. 8, the memory cell array 110a may include a first memory cell array 110-1 and a second memory cell array 110-2. In the example embodiment, the first memory cell array 110-1 may work as a main cell, and the second memory cell array 110-2 may work as a buffer.

In the example embodiment, the first memory cell array 110-1 and the second memory cell array 110-2 may perform a write operation according to different write modes.

Also, as illustrated in FIG. 8, an RWC layer may be disposed below the first memory cell array 110-1. The RWC (the element 140 in FIG. 1, including the write circuit 141 and the read circuit 142) may perform a write operation and a read operation with respect to a plurality of memory cells included in the memory cell array 110a. While the RWC layer is illustrated in FIG. 8 as being disposed below the memory cell array 110a, a position of the RWC layer is not limited thereto.

A first memory cell array 110-1 and a second memory cell array 110-2 illustrated in FIG. 8 may be disposed on the same layer. However, an example embodiment thereof is not limited thereto. The first memory cell array and the second memory cell array may be disposed on different layers.

Figure 9:
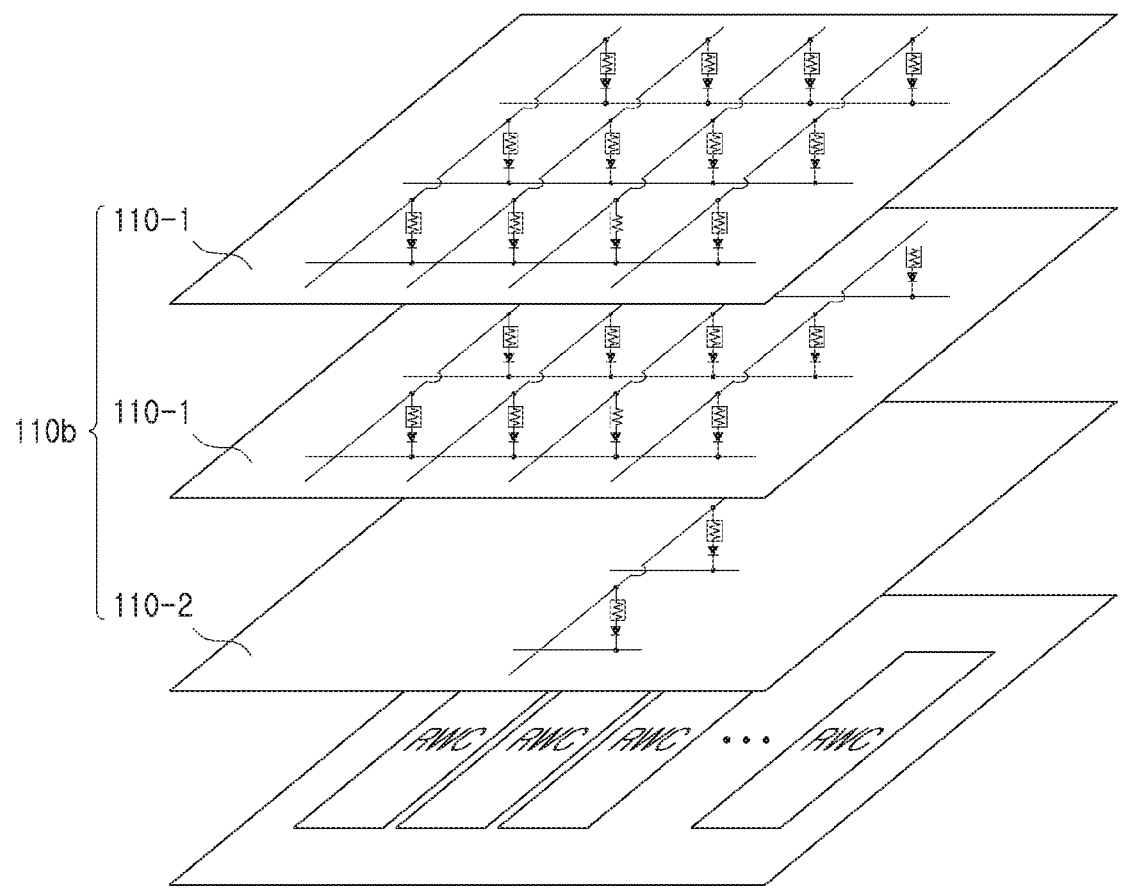
FIG. 9 is a diagram illustrating a memory cell array 110*b* according to another example embodiment of the present disclosure.

FIG. 9 is a diagram illustrating a memory cell array 110b according to an example embodiment of the inventive concept. Referring to FIG. 9, a memory cell array 110b may include a plurality of first memory cell arrays 110-1 disposed on different layers and a second memory cell array 110-2 disposed on layers different from the layers on which the first memory cell arrays 110-1 and 110-2 are disposed.

In the example embodiment, at least two of the first memory cell arrays 110-1 and the second memory cell array 110-2 may perform a write operation according to different write modes.

In the description below, it is assumed that a non-volatile memory device 100 includes two layers having a plurality of tiles for ease of description.

Figure 10:
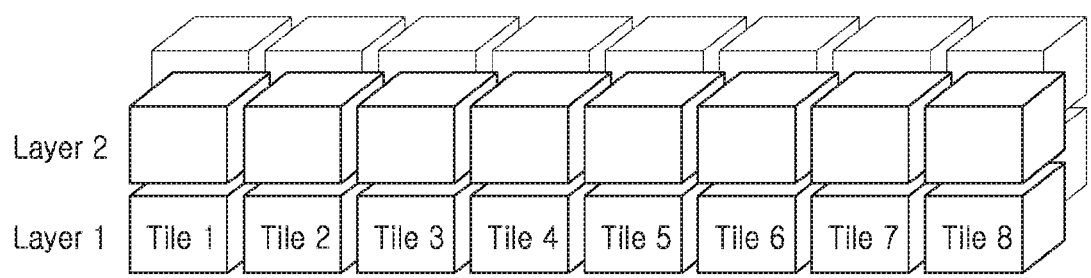
FIG. 10 is a diagram illustrating layers of a non-volatile memory device 100 according to another example embodiment of the present disclosure.

FIG. 10 is a diagram illustrating layers of a non-volatile memory device 100 according to an example embodiment of the inventive concept. As illustrated in FIG. 10, two rows of tiles Tile 1 to Tile 8 are disposed on a first layer, and two rows of tiles are disposed on a second layer. However, the number of tiles disposed on a single layer and the number of rows are not limited thereto.

Figure 11:
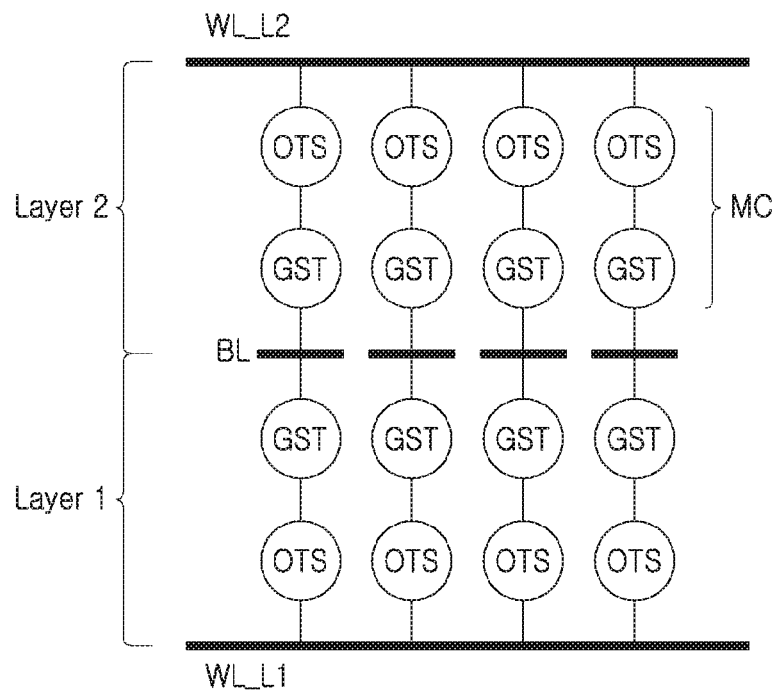
FIG. 11 is a diagram illustrating memory cells included in the tile illustrated in FIG. 10.

FIG. 11 is a diagram illustrating memory cells included in the tile illustrated in FIG. 10. Referring to FIG. 11, memory cells of a first layer are connected between a word line WL_L1 and a bit line BL of a first layer, and memory cells of a second layer are connected to a word line WL_L2 and a bit line BL of a second layer. Each of the first and second memory cells may include a variable device (e.g., a GST) and a switching device (e.g., an OTS). The memory cells may be disposed symmetrically with reference to a bit line BL.

The structure of the memory cell illustrated in FIG. 11 is merely an example.

Figure 12:
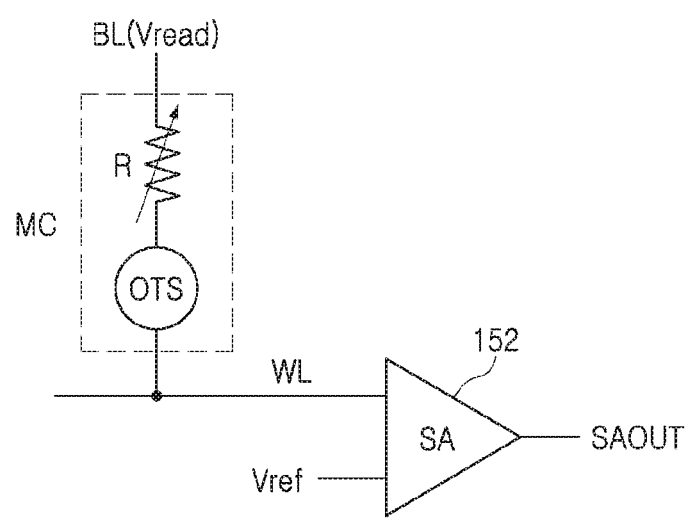
FIG. 12 is a diagram illustrating a sense amplifier SA of a read circuit 142 according to an example embodiment of the present disclosure.

FIG. 12 is a diagram illustrating a sense amplifier (SA) 152 of a read circuit 142 according to an example embodiment of the inventive concept. Referring to FIG. 12, the sense amplifier (SA) 152 may compare a voltage of a word line WL connected to a memory cell MC with a reference voltage Vref and may output a sensing result SAOUT. The memory cell MC may be disposed between a selected word line WL and a selected bit line BL. In a read operation, a read voltage Vread may be applied to the selected bit line BL.

In the example embodiment, the read voltage Vread may be varied depending on a mode of a write operation (a normal mode, a DCW mode, an aDCW mode, and a RDSKIP aDCW mode).

In another example embodiment, the read voltage Vread may be varied depending on an internal policy of the non-volatile memory device 100. The internal policy may include the sensing a degree of deterioration of a memory cell, environmental information, time information, position information, and the like, and changing a read level of the read voltage Vread according to the sensing result.

In another example embodiment, the read voltage Vread may be varied according to information transferred from an external device (e.g., a memory controller).

The sense amplifier (SA) 152 illustrated in FIG. 12 is merely an example. For example, a sense amplifier in an example embodiment may also sense data by comparing a voltage of the bit line with the reference voltage Vref.

Figure 13:
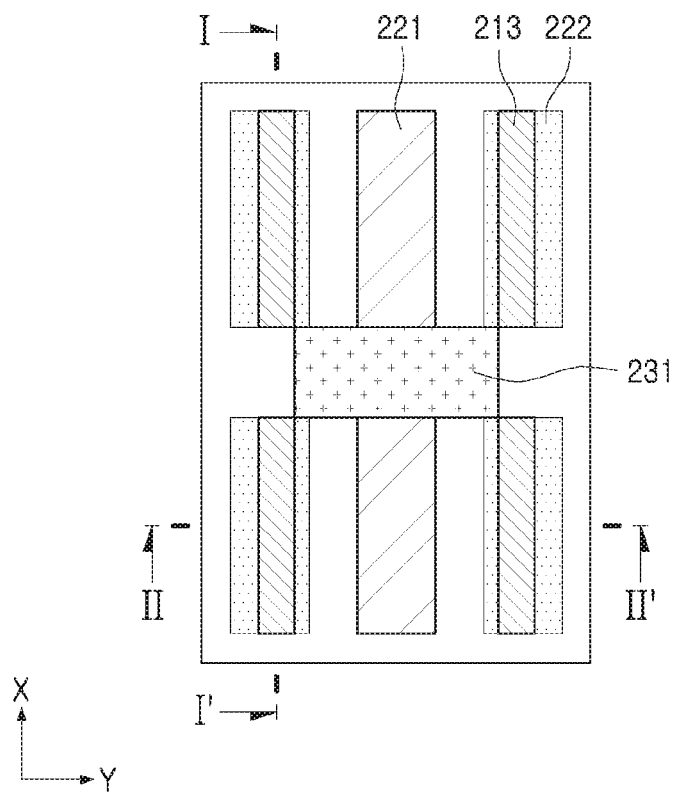
FIG. 13 is a diagram illustrating a tile viewed from the top according to an example embodiment of the present disclosure.

FIG. 13 is a diagram illustrating a top view of a tile according to an example embodiment of the inventive concept. Referring to FIG. 13, a row decoder 221 (1F LX) for selecting memory cells of a first layer and a row decoder 222 (2F LX) for selecting memory cells of a second layer may be alternately disposed in an X axis direction. For selecting a bit line shared by the memory cells of the first layer and the memory cells of the second layer, a column decoder 231 (LY) may be disposed in an Y axis direction. The Y axis direction may be perpendicular to the X axis direction. A word line 213 (CCW2) may be disposed on an upper end of the row decoder 222 of the second layer in the X axis direction.

Figure 14:
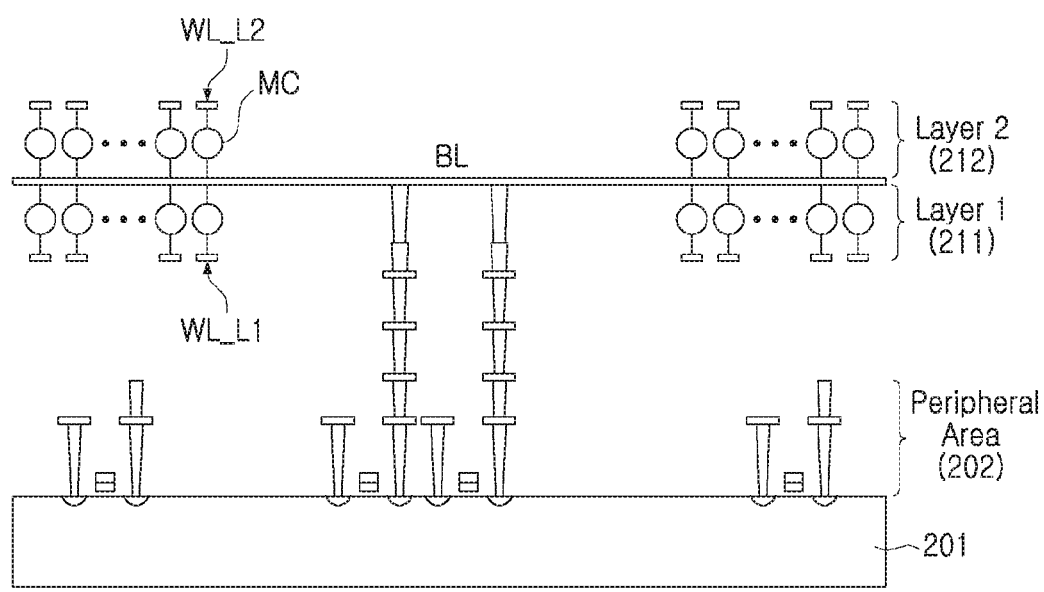
FIG. 14 is a cross-sectional diagram along line I-I' in FIG. 13.

FIG. 14 is a cross-sectional diagram along line I-I' in FIG. 13. Referring to FIG. 14, a non-volatile memory device may be implemented to have a core-on-peripheral (CoP) structure. For example, memory cells of a first layer 211 and memory cells of a second layer 212 may be disposed on an upper portion of a PERI-area 202. The PERI-area 202 may include the word line driver 120 (row decoders), the bit line driver 130 (column decoders), the read and write circuit 140, the data input and output circuit 150, the error correction circuit 160, or the control logic 170, illustrated in FIG. 1. In the example embodiment, the PERI-area 202 may be disposed on a substrate 201. The PERI-area 202 may include a peripheral circuit that includes at least one of the word line driver 120, the bit line driver 130, the read and write circuit 140, the data input and output circuit 150, the error correction circuit 160, and the control logic 170.

As illustrated in FIG. 14, a bit line BL shared by the first layer 211 and the second layer 212 may be connected to the PERI-area 202 through at least one via. Further as shown in FIG. 14, first memory cells MC in the first layer 211 and second memory cells MC in the second layer 212 may be symmetrically positioned relative to the bit line BL.

Figure 15:
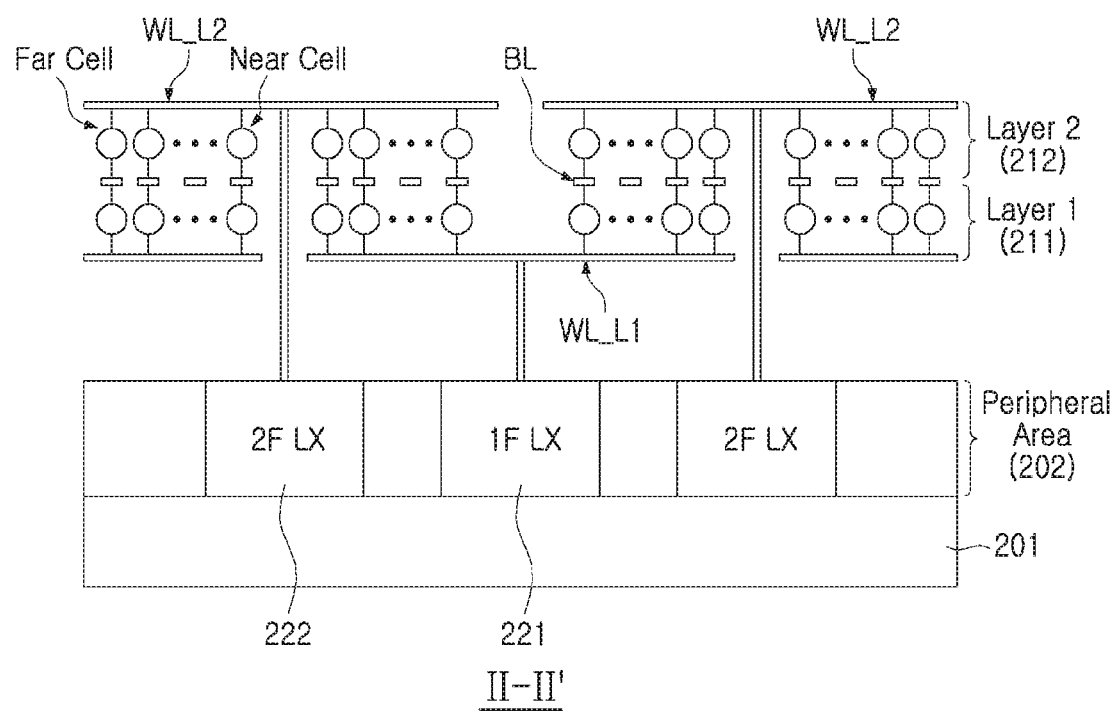
FIG. 15 is a cross-sectional diagram along line II-II' in FIG. 13.

FIG. 15 is a cross-sectional diagram along line II-II' in FIG. 13.

As illustrated in FIG. 15, a word line WL_L1 of the first layer 211 may be connected to a row decoder 221 (1F LX) formed in a PERI-area 202 through at least one via. Also, a word line WL_L2 of a second layer 212 may be connected to a row decoder 222 (2F LX) formed in the PERI-area 202 through at least one via.

As illustrated in FIG. 15, a near cell connected to the row decoder 222 at a relatively short distance may be present, and a far cell connected to the row decoder 222 at a relatively far distance may be present.

Figure 16A:
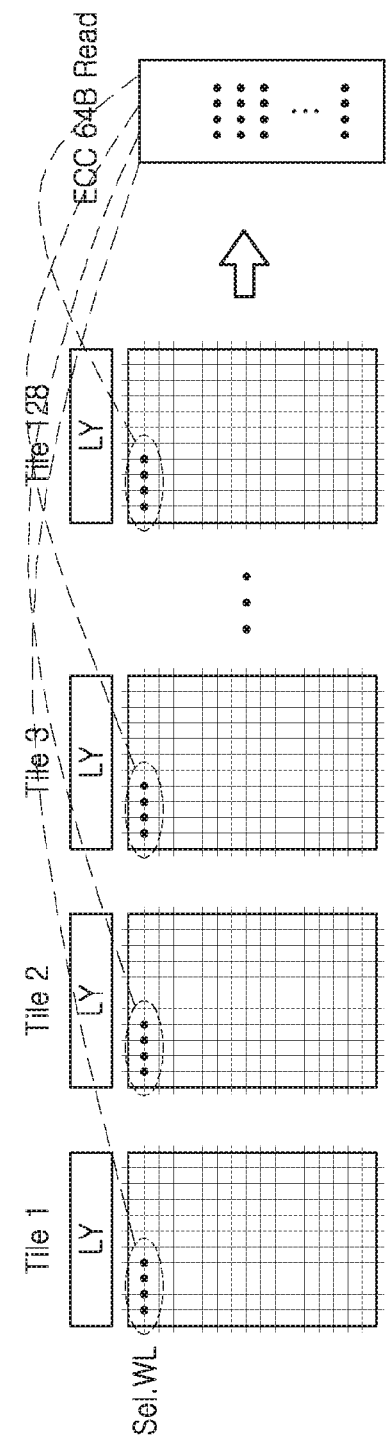
FIGS. 16A and 16B are diagrams illustrating a read operation of a non-volatile memory device.
Figure 16B:
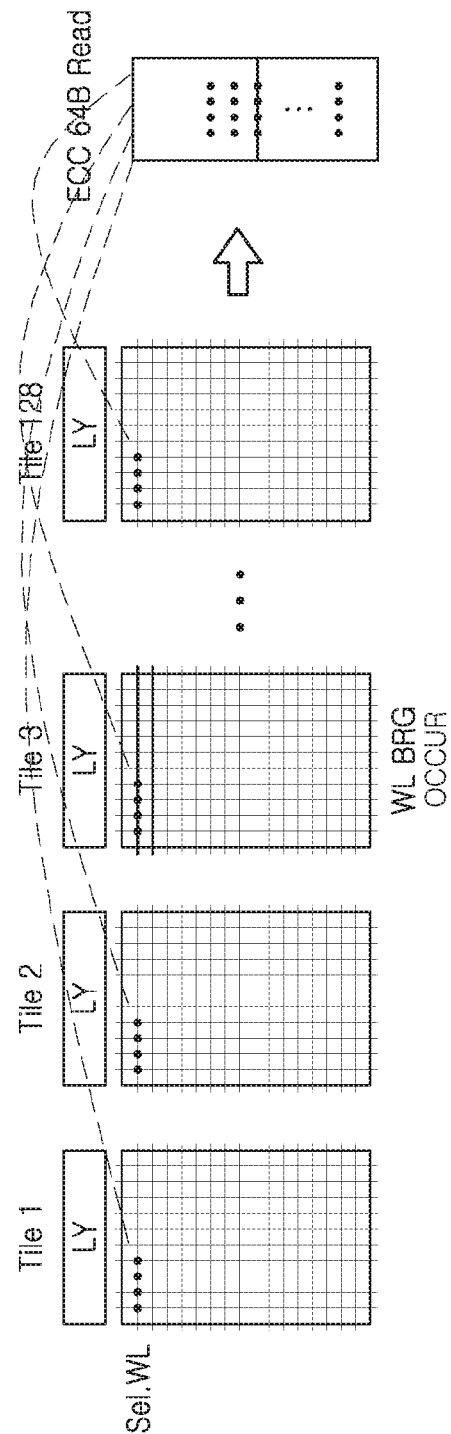

FIGS. 16A and 16B are diagrams illustrating a read operation of a non-volatile memory device. A non-volatile memory device may configure sector data by merging bits of data corresponding to the same position in a tile. For example, as illustrated in FIG. 16A, four bits may be included in a single tile such that 64 bits of sector data may be configured by 128 tiles. However, it may be highly likely that sector data of memory cells in a worst region, near regions of LY/LX, in a tile may have a problem since process properties of the tiles are the same. In other words, since an edge bit in a tile may be merged, when the edge area in the tile is worst, failures may occur in a read operation. When all the read operations in a central area pass, even when an ECC bit of the central area remains, a chip may be processed as a failure.

Also, as illustrated in FIG. 16B, when a word line bridge (WL BRG) occurs, an error correction circuit 160 (see FIG. 1) may consume 4-bit/64-Byte to correct an error. When the error correction circuit 160 (see FIG. 1) has a capability of 5-bit/64-Byte, it is highly likely that a read operation will be processed as a failure when a word line bridge occurs. In other words, even when a single word line bridge occurs, a read operation may be processed as a failure. Also, the error correction circuit 160 may consume 2-bit/64-Byte for correcting an error when a bit line bridge occurs.

Instead, in the non-volatile memory device 100 in the example embodiment, an address scramble (a read scramble) is configured by combination of different tiles, different word lines, or different bit lines in a read operation such that a read operation may be performed in an equalized level in a tile. Accordingly, even when a word line/bit line bridge occurs, the number of ECC bit(s) consumed for correcting an error in the error correction circuit 160 may be minimized.

Figure 17A:
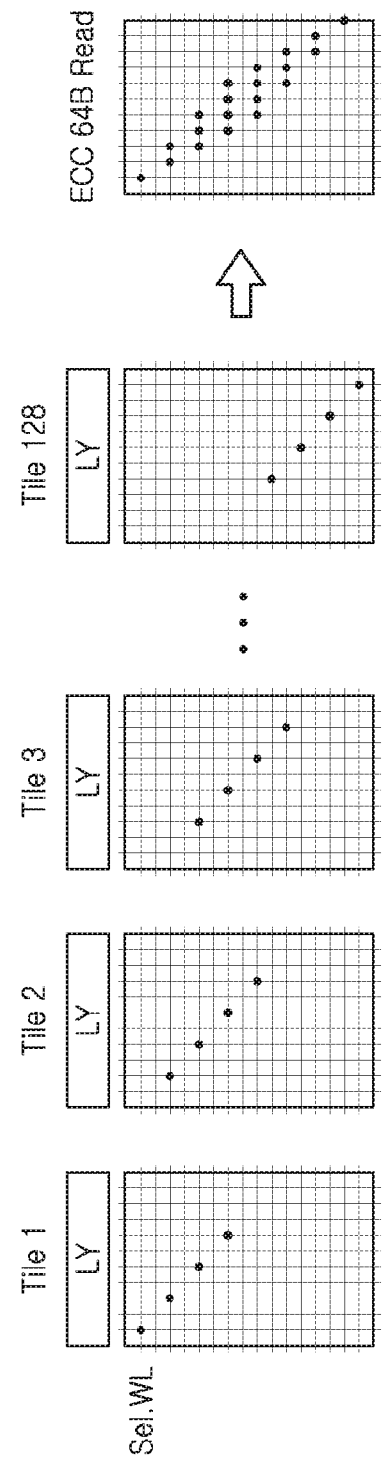
FIGS. 17A and 17B are diagrams illustrating a non-volatile memory device 100 to which an address scramble is applied according to an example embodiment of the present disclosure.
Figure 17B:
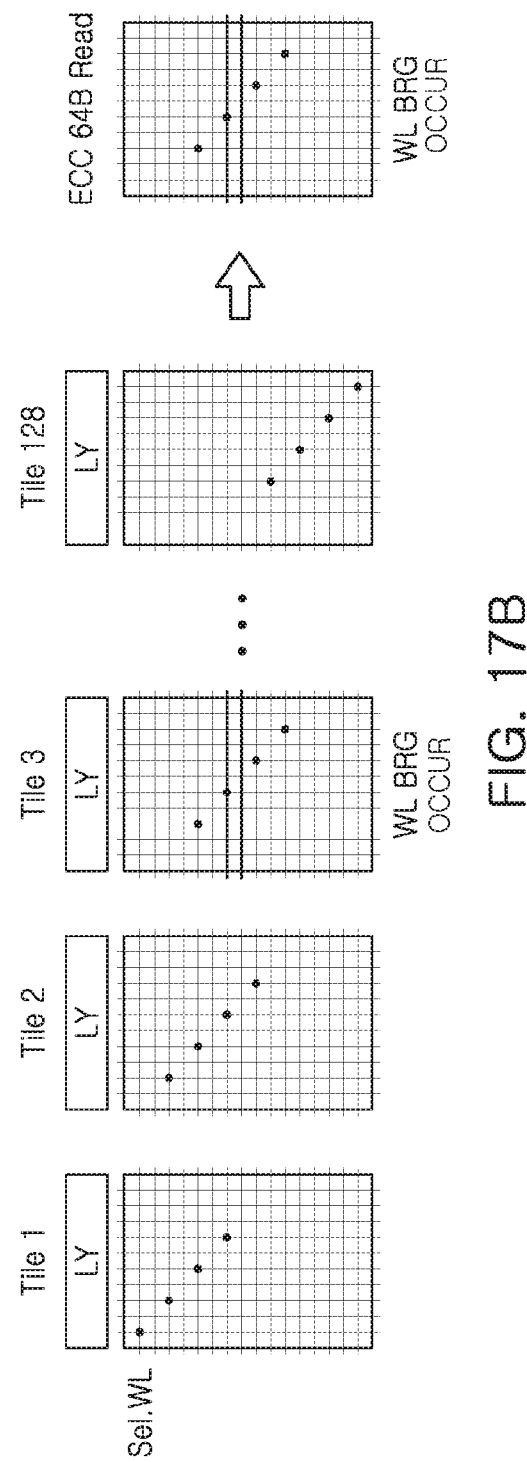

FIGS. 17A and 17B are diagrams illustrating a non-volatile memory device 100 in which an address scramble is applied according to an example embodiment of the inventive concept.

Referring to FIG. 17A, in tiles Tile 1 to Tile 128, positions of memory cells activated (e.g., selected) by a selected word line may be different from each other.

In the example embodiment, physical positions activated by selected word lines in the tiles Tile 1 to Tile 128 may be determined by an arithmetic sequence in a word line direction (a direction from the top to the bottom). For example, as illustrated in FIG. 17A, activated physical positions may be disposed below by 2k+1 (k is a natural number) in a word line direction. Accordingly, in each of the tiles in the example embodiment, a position of a memory cell activated by an address may have a regular pattern.

In the example embodiment, a physical position activated by a selected word line in the tiles Tile 1 to Tile 128 may be determined by an arithmetic sequence in a bit line direction (a direction from the left to the right). For example, as illustrated in FIG. 17A, the activated physical position may be disposed on the side by 1 in the bit line direction.

Accordingly, as illustrated in FIG. 17A, the physical position activated by a sector read operation may be disposed in a central region of a decoder (LX/LY), and may rarely be disposed in a region adjacent to the decoder (LX/LY). Accordingly, the non-volatile memory device 100 in the example embodiment may perform a read operation to equalize overall performance of the tiles. For example, if a sector read operation of FIG. 17A is associated with first through fourth row addresses and first through fourth column addresses, using these addresses to select word and bit lines of the first tile could cause word lines 1, 3, 5, and 7 and bit lines 1, 3, 5, and 7 to be selected while using the same addresses to select word and bit lines of the second tile could cause word lines 3, 5, 7, and 9 and bit lines 3, 5, 7, and 9 to be selected.

As illustrated in FIG. 17B, when an address scramble is applied in the example embodiment, even when a word line bridge occurs, the error correction circuit 160 (see FIG. 1) may consume 1-bit/64-Byte to correct an error caused by the word line bridge. Accordingly, a yield may improve as compared to consuming 4-bit/64-Byte.

In FIGS. 17A and 17B, sector data (e.g., data for a sector) may be configured by selecting four word lines in a single tile. However, example embodiment thereof are not limited thereto. The non-volatile memory device in the example embodiment may configure sector data by selecting a single word line in a single tile. In an exemplary embodiment, when multiple word lines and bit lines represent the sector data, they are chosen so that they are spaced apart from one another.

Figure 18:
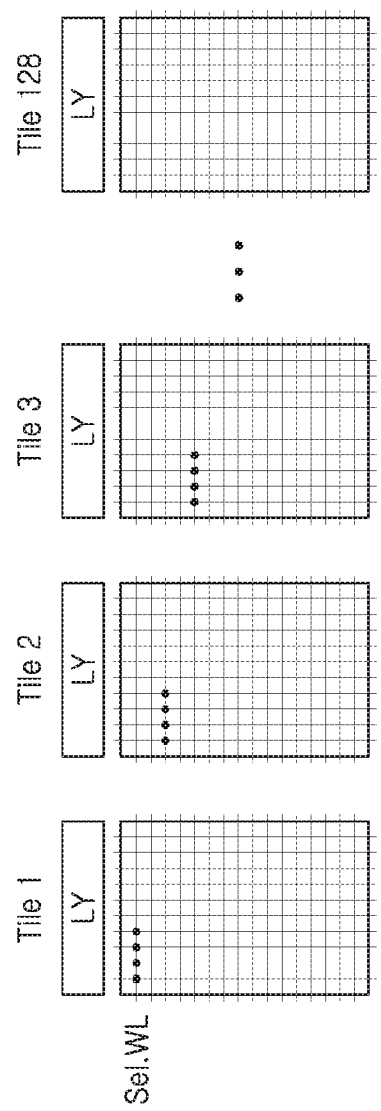
FIG. 18 is a diagram illustrating a non-volatile memory device 100 to which an address scramble is applied according to an example embodiment of the present disclosure.

FIG. 18 is a diagram illustrating a non-volatile memory device 100 in which an address scramble is applied according to an example embodiment of the inventive concept. Referring to FIG. 18, in each of tiles Tile 1 to Tile 128, four memory cells connected to a single select word line may be activated, differently from the example embodiments illustrated in FIGS. 17A and 17B. Each tile may perform a burst read operation from the four memory cells in response to a single row address. For example, if a sector read operation of FIG. 18A is associated with a first row address and first through fourth bit addresses, using these addresses to select a word line and bit lines of the first tile could cause word line 1 and bit lines 1-4 to be selected while using the same addresses to select a word line and bit lines of the second tile could cause word line 3 and bit lines 1-4 to be selected.

In the non-volatile memory device 100 in the example embodiment, activated physical positions in a corresponding tile may be different according to layers.

Figure 19:
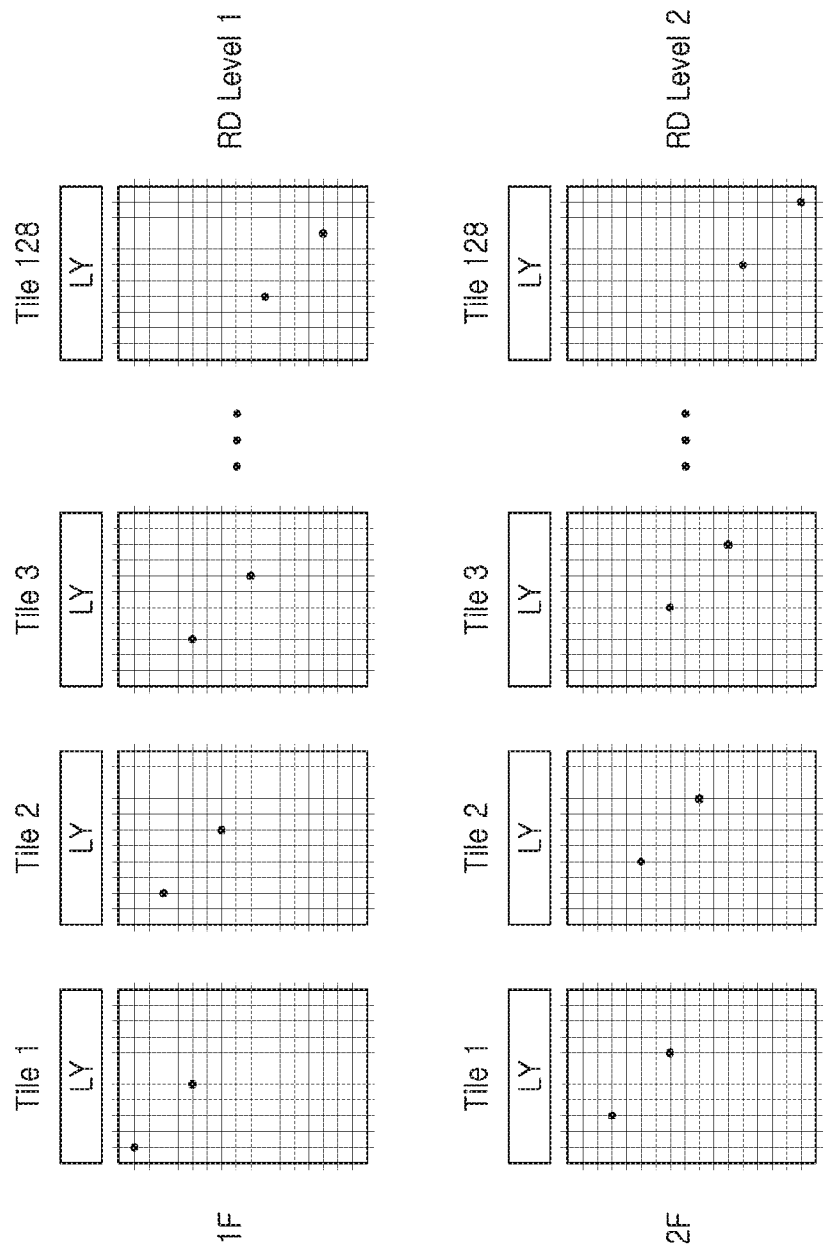
FIG. 19 is a diagram illustrating an address scramble of a non-volatile memory device 100 according to an example embodiment of the present disclosure.

FIG. 19 is a diagram illustrating an address scramble of a non-volatile memory device 100 according to an example embodiment of the inventive concept. Referring to FIG. 19, a physical position activated in one of tiles on a first layer may be different from a physical position activated in one of tiles on a second layer. For example, if a sector read operation of FIG. 19 is associated with first through fourth row addresses and first through fourth column addresses, using these addresses to select word and bit lines of the first tile could cause word lines 1 and 5 and bit lines 1 and 5 of the first tile of first layer to be selected and word lines 3 and 7 and bit lines 3 and 7 of the first tile of the second layer to be selected; while using the same addresses to select word and bit lines of the second tile could cause word lines 3 and 7 and bit lines 2 and 6 of the second tile of first layer to be selected and word lines 5 and 9 and bit lines 4 and 8 of the second tile of the second layer to be selected.

Also, as illustrated in FIG. 19, the non-volatile memory device in the example embodiment may have different read levels (RD Level 1 and RD Level 2) for each different layer. For example, the voltage applied to a given word line or bit line of one layer may be different from the voltage applied to a given word line or bit line of another layer.

The non-volatile memory device in the example embodiment may have different read levels for each different tile group. For example, if tiles 1-4 are part of a first tile group and tiles 5-9 of a same layer are part of a second a second tile group, the read levels of the first tile group may differ from the read levels of the second tile group.

Figure 20:
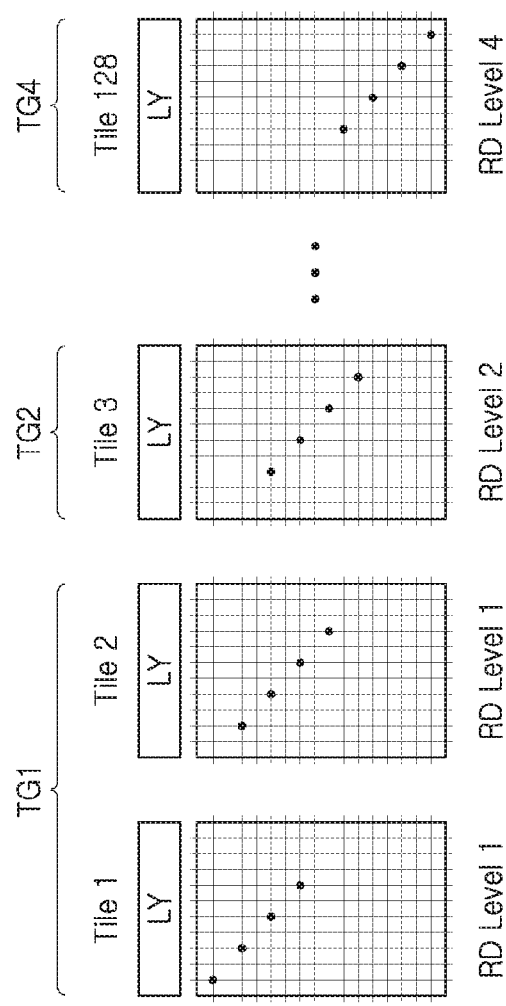
FIG. 20 is a diagram illustrating a read level of each tile group of a non-volatile memory device according to an example embodiment of the present disclosure.

FIG. 20 is a diagram illustrating a read level of each tile group of a non-volatile memory device according to an example embodiment. Referring to FIG. 20, a first tile group TG1 (first and second tiles) has a first read level RD Level 1, a second tile group TG2 (a third tile) has a second read level RD Level 2, and a fourth tile group TG4 (a 128th tile) has a fourth read level RD Level 4.

The number of tiles included in a single tile group is not limited to the example illustrated in FIG. 20. Various numbers of tiles may be present in a single tile group. Also, a read level corresponding to each of the tile groups may be present.

In FIGS. 17A to 20, an address scramble is applied to each tile. However, example embodiments thereof are not limited thereto. In the example embodiment, an address scramble may be applied to each of the tile groups, FIGS. 21A, 21B, and 21C are diagrams illustrating tile groups in each of which an address scramble is applied according to an exemplary embodiments of the inventive concept.

Figure 21A:
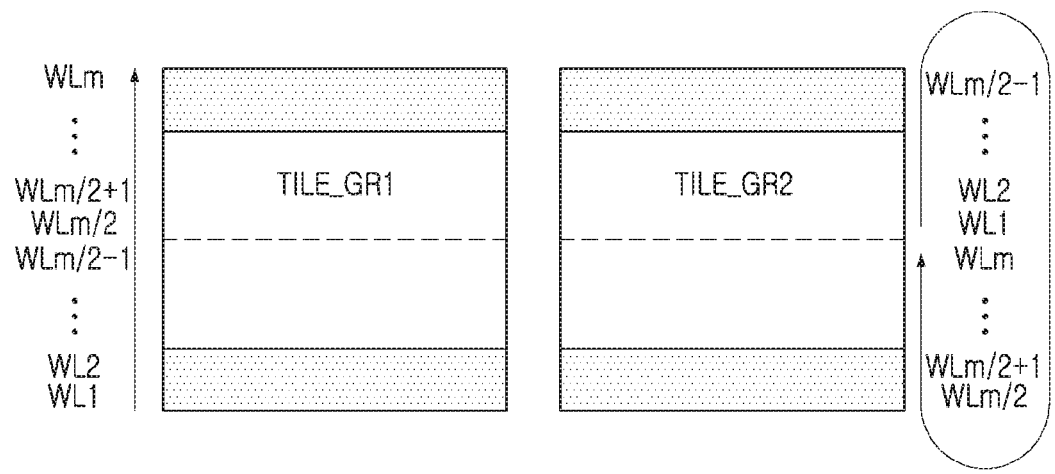
FIGS. 21A, 21B, and 21C are diagrams illustrating tile groups to which an address scramble is applied according to an example embodiment of the present disclosure.

Referring to FIG. 21A, a word line scramble may be applied to a first tile group Tile_GR1 and a second tile group Tile_GR2. The first tile group Tile_GR1 may sequentially assign word line numbers from a lower edge to an upper edge, and the second tile group Tile_GR2 may alternately assign word line numbers in the upper edge and the lower edge. The method of assigning the word line numbers illustrated in FIG. 21A is one of examples. For example, a circular shift right of two word lines can be performed with respect to the word lines of the first tile group Tile_GR1 to generate the word lines of the second tile group Tile_GR2. For example, if m=6 and the lower most word line of the first tile group Tile_GR1 corresponds to a first word line WL1, a circular shift right twice of one yields three, and thus the lower most word line of the second tile group Tile_GR2 corresponds to a third word line (WL6/2) WL3. The unit of shifting may be different from two in alternate embodiments (e.g., 1, 3, 4, etc.).

Figure 21B:
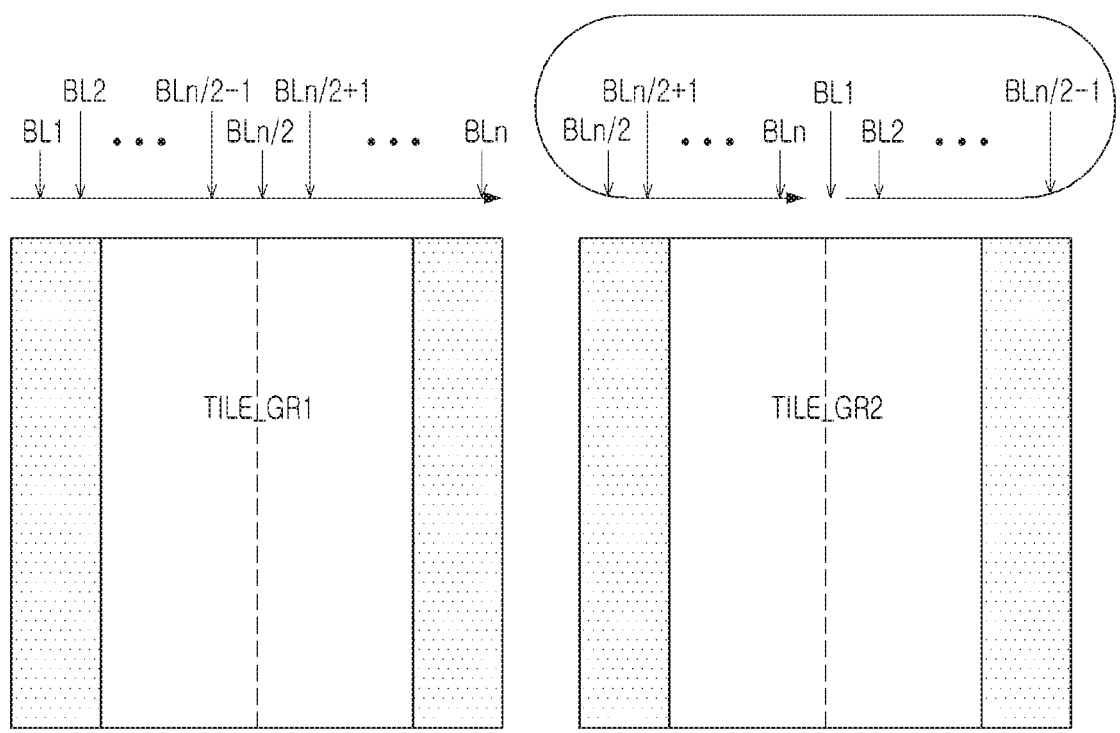

Referring to FIG. 21B, a bit line scramble may be applied to the first tile group Tile_GR1 and the second tile group Tile_GR2. The first tile group Tile_GR1 may sequentially assign bit line numbers from the left to the right, and the second tile group Tile_GR2 may alternately assign bit line numbers to the right and the left from a central portion. For example, a circular shift right of two bit lines can be performed with respect to the bit lines of the first tile group Tile_GR1 to generate the bit lines of the second tile group Tile_GR2. For example, if n=6 and the left most bit line of the first tile group Tile_GR1 corresponds to a first word line WL1, a circular shift right twice of one yields three, and thus the lower most word line of the second tile group Tile_GR2 corresponds to a third word line (WL6/2) WL3. The unit of shifting may be different from two in alternate embodiments (e.g., 1, 3, 4, etc.). The method of assigning bit lines illustrated in FIG. 21B is one possible example.

Figure 21C:
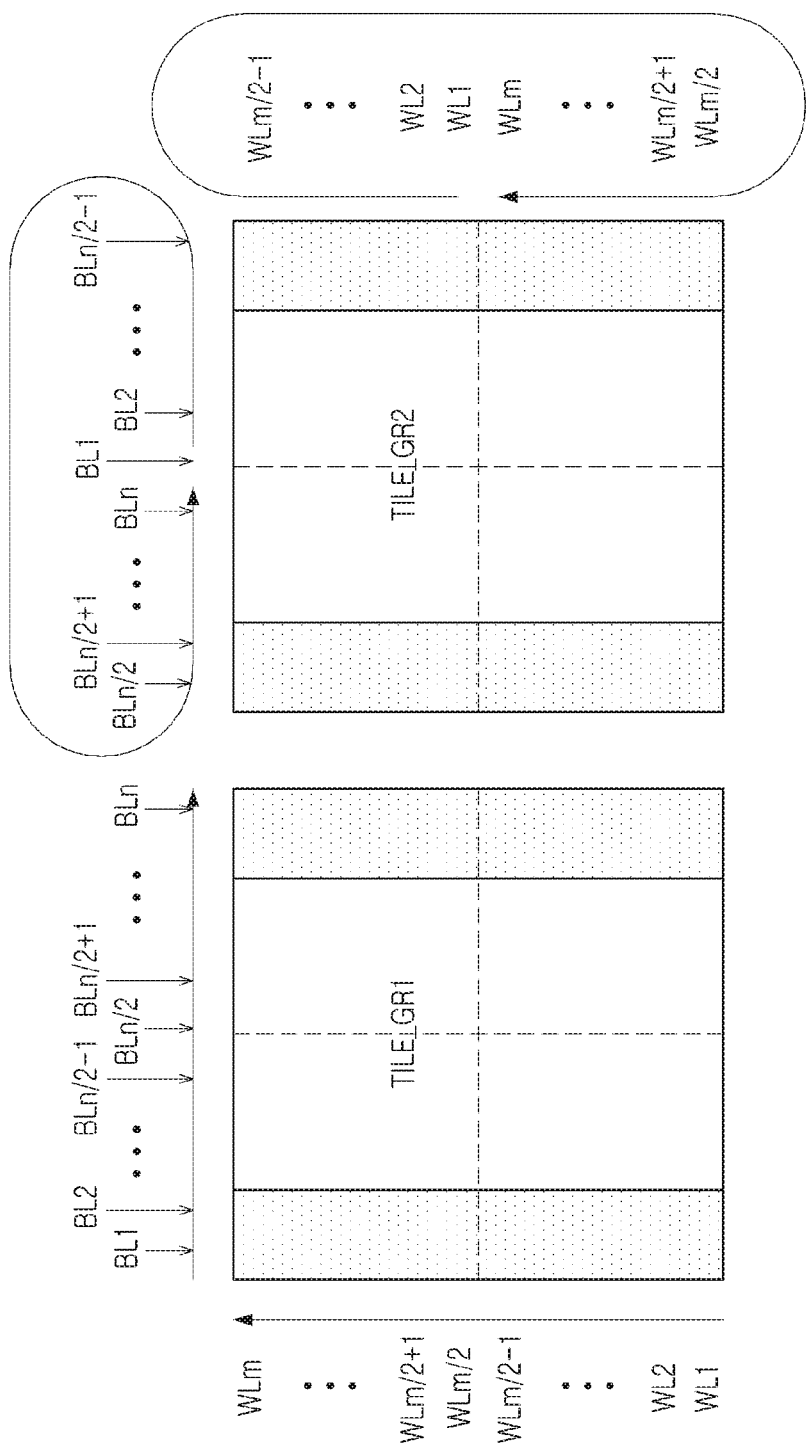

Referring to FIG. 21C, a word line scramble and a bit line scramble may be simultaneously applied to the first tile group Tile_GR1 and the second tile group Tile_GR2.

Figure 22:
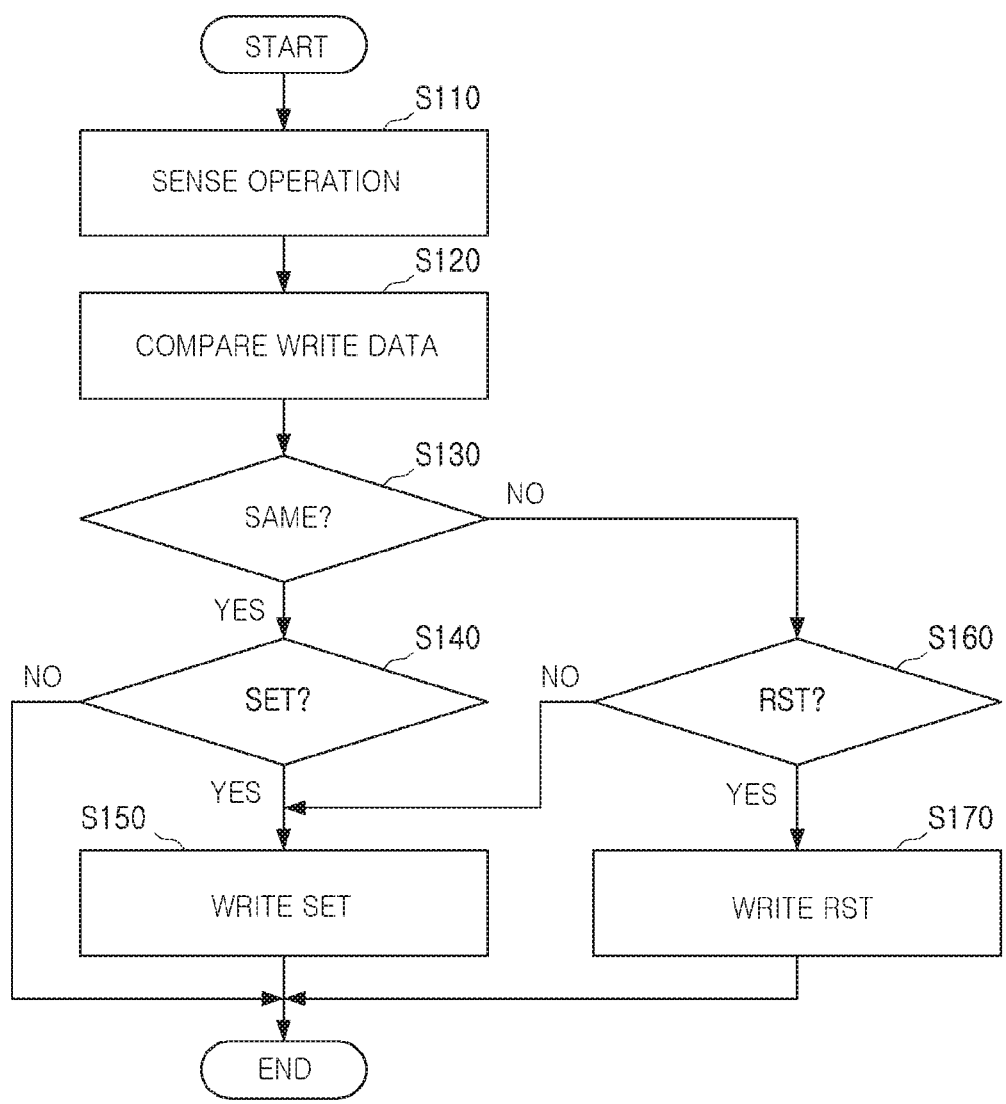
FIG. 22 is a flowchart illustrating a write operation of a non-volatile memory device 100 according to an example embodiment of the present disclosure.

FIG. 22 is a flowchart illustrating a write operation of a non-volatile memory device 100 according to an example embodiment of the inventive concept. Referring to FIGS. 1 to 22, a write operation of the non-volatile memory device 100 may be performed as below.

When a write command, an address, and write data (sector data) are received, a sense operation for data of a memory cell of each of tiles corresponding to an address is performed (S110). The write command, address, and write data (sector data) may be received from an external entity such as a memory controller. For example, a read operation may be performed on a memory cell of the memory cell array 110 at the address to retrieve sense data. The write data is compared with the sense data according to a sense operation (S120). Thereafter, it is determined whether the write data is the same as the sense data (S130).

When the write data is the same as the sense data, it is determined whether the write data is set data (S140). When the write data is set data, a set operation is performed on the memory cell (S145). When write data is not set data, the write operation may be terminated.

When the write data is not the same as the sense data, it is determined whether the write data D_WR is reset data (S160). When the write data is not reset data, a set operation is performed on a memory cell (S150). When the write data is reset data, a reset operation is performed on a memory cell (S170).

The write operation in the example embodiment may use a data compare write method and may simultaneously apply a read skip according to the write data.

Figure 23:
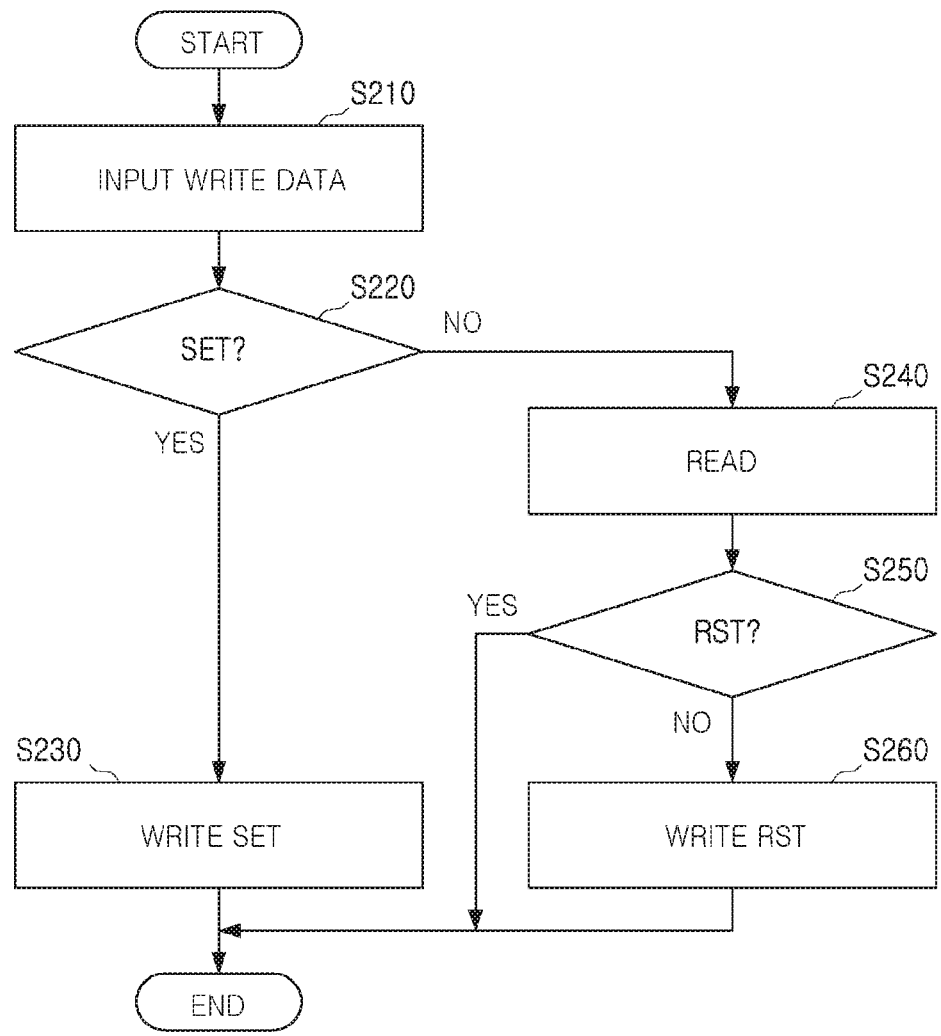
FIG. 23 is a flowchart illustrating a write operation of a non-volatile memory device 100 according to an embodiment of the present disclosure.

FIG. 23 is a flowchart illustrating a write operation of a non-volatile memory device 100 according to an example embodiment of the inventive concept. Referring to FIGS. 1 to 23, a write operation of the non-volatile memory device 100 may be performed as below.

The non-volatile memory device 100 receive a write command, sector data, and an address (S210). The write command, address, and write data (sector data) may be received from an external entity such as a memory controller. It is determined whether write data of the sector data to be written in each of tiles is data "1" corresponding to a set state (S220). When the write data is "1," a set operation is performed on a memory cell corresponding to an address (S230).

When the write data is data "0" corresponding to a reset state, a read operation is performed on a memory cell corresponding to the address (S240). The read operation may be performed using a read voltage at a level equal to or higher than a level of read voltage used during a normal mode.

Thereafter, it is determined whether the read data is in a reset state (S250). When the read data is in a reset state, a write operation is not performed. When the read data is not in the reset state, a reset operation is performed on the memory cell (S260).

Figure 24:
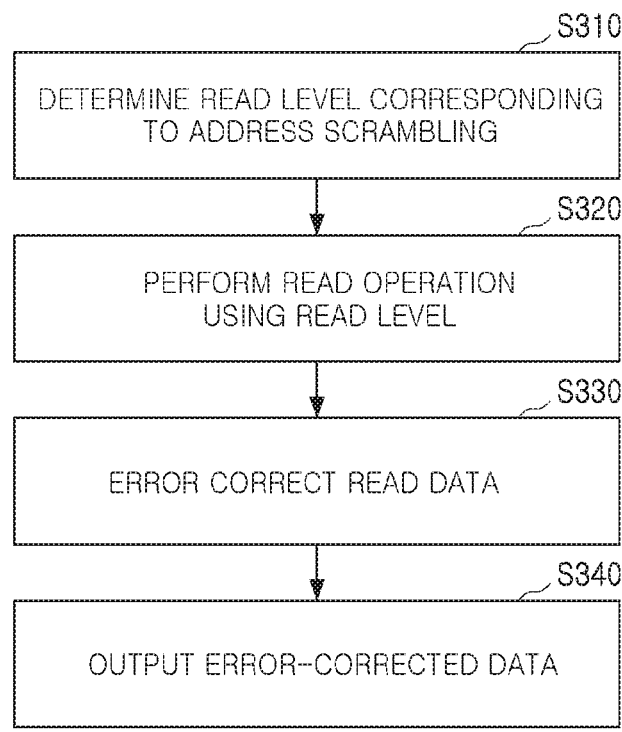
FIG. 24 is a flowchart illustrating a read operation of a non-volatile memory device 100 according to an example embodiment of the present disclosure.

FIG. 24 is a flowchart illustrating a read operation of a non-volatile memory device 100 according to an example embodiment of the inventive concept. Referring to FIGS. 1 to 24, a reading method of the non-volatile memory device 100 may be performed as below.

When a read command and an address are received from an external device (e.g., a memory controller), a non-volatile memory device determines a read level corresponding to address scrambling (S310). For example, as an address scramble may be implemented in various manners according to a combination of a tile position, a word line position, and a bit line position, a read level corresponding to the application of the address scramble may be varied. A read operation is performed for each tile using the determined read level (S320). An error correction operation is performed on the read data (S330). Thereafter, data of which an error has been corrected (e.g., error-corrected data) may be output to an external device (S340).

In the example embodiment, in the read operation, data may be read from a memory cell corresponding to a word line and a bit line selected with a certain interval in response to the same address in different tiles.

In the example embodiment, a plurality of layers formed on a substrate may be included, a plurality of tiles may be included in each of the plurality of layers, and the determining of the read level may include determining a read level of a corresponding layer of the plurality of layers according to an input address.

The read operation in the example embodiment may perform a burst read operation of one bit for each tile. A read operation of four read commands for an address may be performed in each tile to output four bits of data corresponding to a selected word line.

For example, it may be assumed that a read operation is performed by a 64 bit unit in a memory in which 2K of BLs and 4K of WLs are included, as a unit of tiles. A first read operation may output data from memory cells corresponding to (Tile1, W1, B1), (Tile2, W64, B32), (Tile3, W128, B64), . . . (Tile64, W4032, B2016) in response to a first address. A second read operation may output data from memory cells corresponding to (Tile1, W1, B2), (Tile2, W64, B33), (Tile3, W128, B65), . . . (Tile63, W4032, B2017) in response to a second address. The term "W" may be an abbreviation for a physical position number of a word line, and the term "B" may be an abbreviation for a physical position number of a bit line.

In the read operation in the example embodiment, four bits of a burst read operation may be performed for each tile. To output four bits of data corresponding to a selected word line, a four-bit burst read operation for a row address may be performed in each tile.

Figure 25:
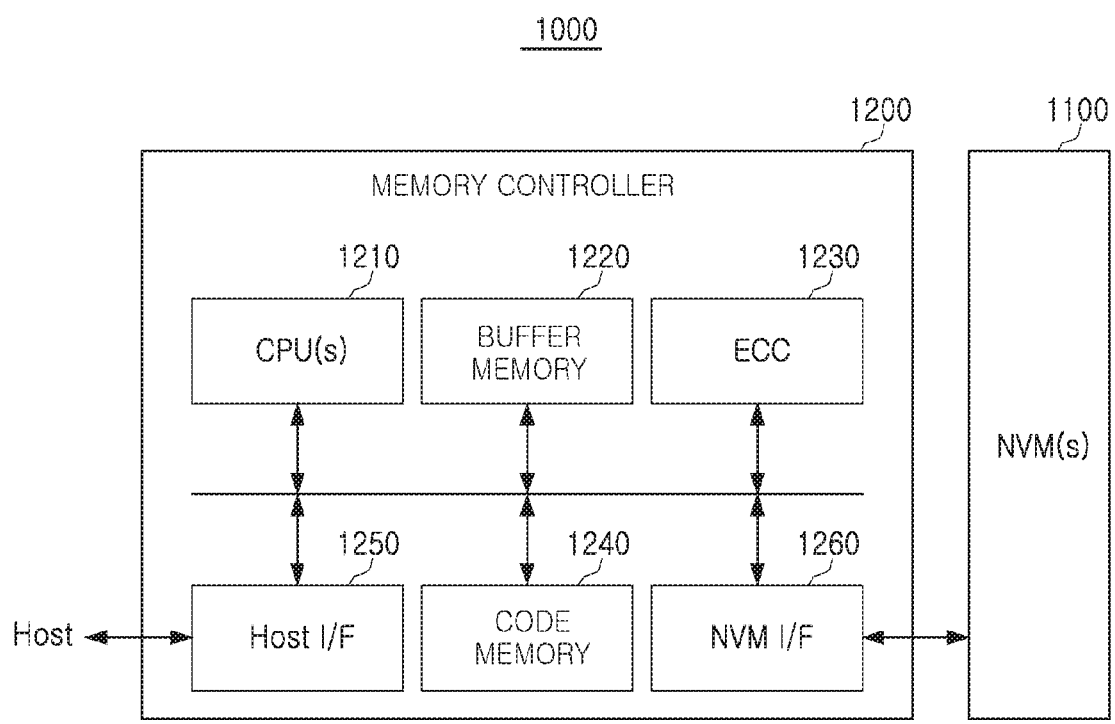
FIG. 25 is a diagram illustrating a storage device 1000 according to an example embodiment of the present disclosure.

FIG. 25 is a diagram illustrating a storage device 1000 according to an example embodiment of the inventive concept. Referring to FIG. 25, a storage device 1000 includes at least one non-volatile memory device 1100 (NVM(s)) and a memory controller 1200.

The non-volatile memory device 1100 may be implemented to equalize a read level by applying an address scramble in a read operation as illustrated in FIGS. 1 to 24. In the example embodiment, the non-volatile memory device 1100 may be implemented to be provided with an external high voltage optionally.

The memory controller 1200 may be connected to the non-volatile memory device 1100. The memory controller 1200 may be a solid-state disk controller. The memory controller 1200 may include a least one processor 1210 (CPU(s)), a buffer memory 1220, an error correction circuit 1230, a code memory 1240, a host interface 1250, and a non-volatile memory interface 1260.

The processor 1210 may be implemented to control overall operations. The processor 1210 may be implemented by a central processing unit (CPU) or an application processor (AP).

The buffer memory 1220 may temporarily store data required for operation of the memory controller 1200. The buffer memory 1220 illustrated in FIG. 25 may be disposed in the memory controller 1200, but an example embodiment thereof is not limited thereto. The buffer memory 1220 may be externally disposed as a separate intellectual property (IP).

The error correction circuit 1230 may calculate an error correction code value of data to be written in a write operation, may correct an error of data read in a read operation based on the error correction code value, and may correct an error of data recovered from the non-volatile memory device 1100. The error correction circuit 1230 may correct an error using a low density parity check (LDPC) code, a Bose-Chauhuri-Hochquenghem (BCH) code, a turbo code, a Reed-Solomon code, a convolution code, a recursive systematic code (RSC), coded modulations such as trellis-coded modulation (TCM), block coded modulation (BCM), and the like. The code memory 1240 may store code data required for operation of the memory controller 1200. The code memory may be implemented as a non-volatile memory device. The host interface 1250 may provide a function of interfacing with an external device. The non-volatile memory interface 1260 may provide a function of interfacing with the non-volatile memory device 1100. Although not illustrated in the diagram, the memory controller 1200 may include a wireless communication function (e.g., Wi-Fi).

In the example embodiment, the memory controller 1200 may manage read levels of tiles to be equalized.

The storage device 1000 in the example embodiment may include the non-volatile memory device 1100 which may equalize read levels of a read operation or the memory controller 1200, thereby improving reliability of the storage device.

Figure 26:
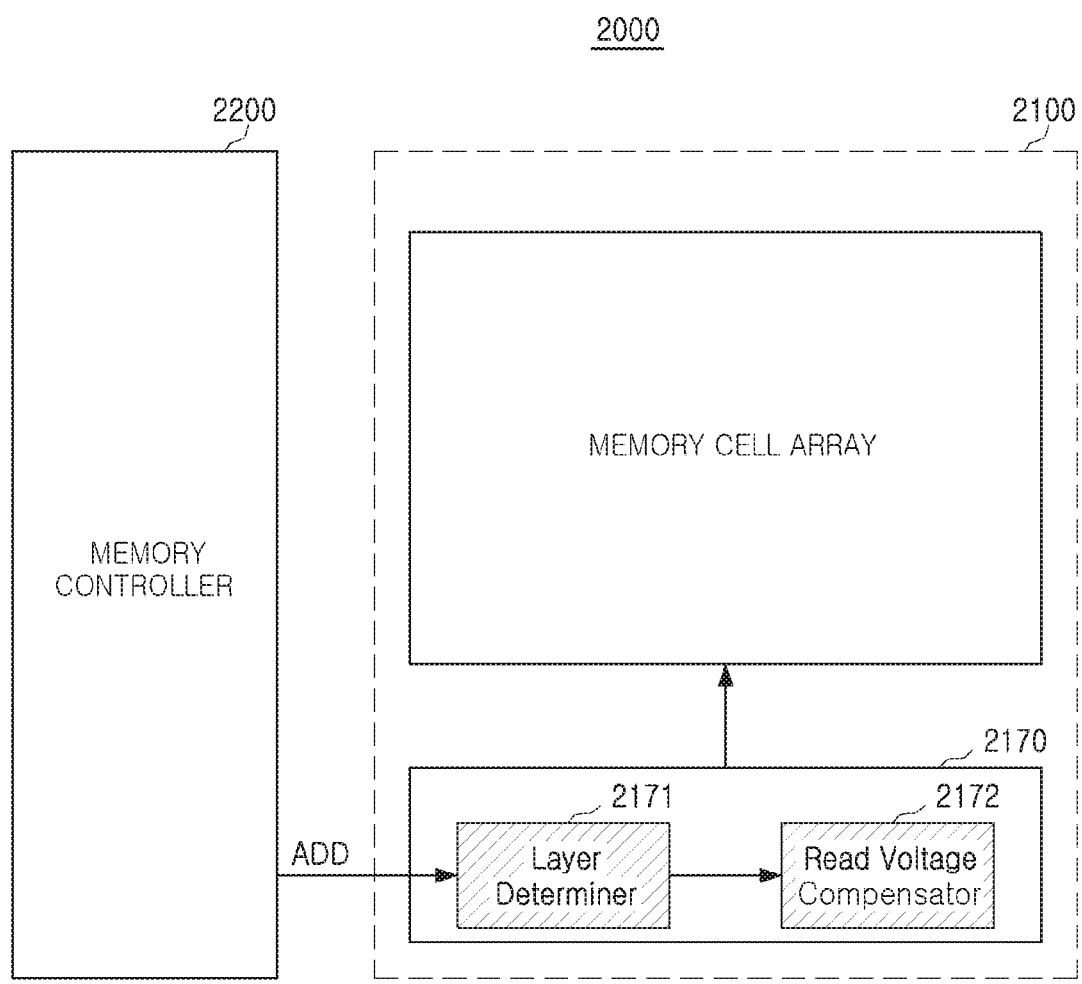
FIG. 26 is a diagram illustrating a memory system 2000 to which a certain read level is applied according to an example embodiment of the present disclosure.

FIG. 26 is a diagram illustrating a memory system 2000 in which a certain read level is applied to a certain portion according to an example embodiment. The memory system 2000 includes a memory controller 2200 and a non-volatile memory device 2100. Referring to FIG. 26, when an address ADD is received from a memory controller 2200, a control logic 2170 of the memory device 2100 may be implemented to identify a position of a corresponding layer according to the received address ADD, and to compensate for a corresponding read level according to the identified layer. The control logic 2170 may include a layer identifier 2171 and a read voltage compensator 2172.

Different read voltages may be determined depending on environmental information (lifespan, a degree of deterioration, a temperature, an error bit, and the like).

Figure 27:
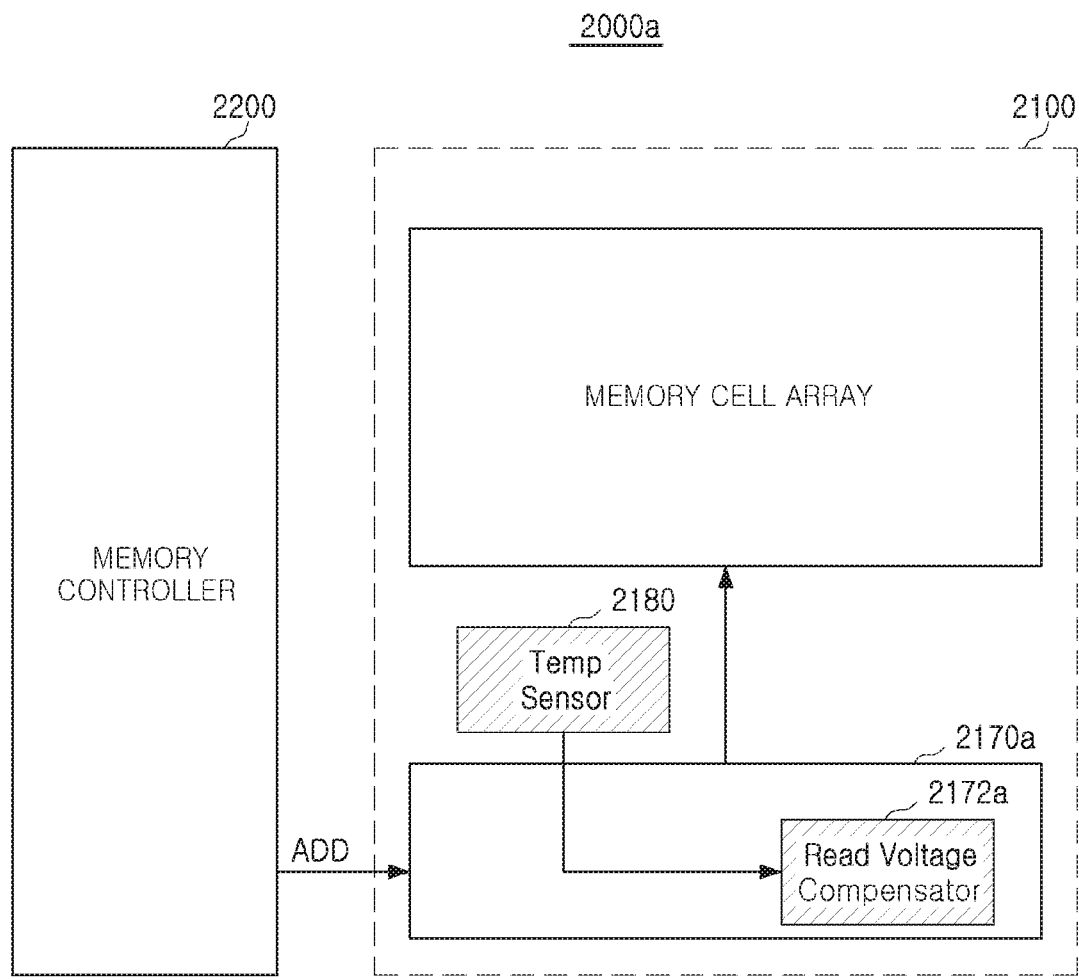
FIG. 27 is a diagram illustrating a memory system 2000a which may compensate for a read voltage using environmental information according to an example embodiment of the present disclosure.

FIG. 27 is a diagram illustrating a memory system 2000a which may compensate for a read voltage according to environmental information. Referring to FIG. 27, the memory system 2000a may collect environmental information, and may select an optimized read level based on the collected information. The environmental information may include cycle information related to the number of write operation(s) and the number of read operation(s) performed on a memory cell, temperature information, or the number of error bits.

As illustrated in FIG. 27, a temperature sensor 2180 may sense a temperature of the non-volatile memory device 2100 and may transfer a result of the sensing to a read voltage compensator 2172a. The read voltage compensator 2172a may determine an optimized read level according to the sensed temperature.

The non-volatile memory device in the example embodiment may be applied to a server system.

Figure 28:
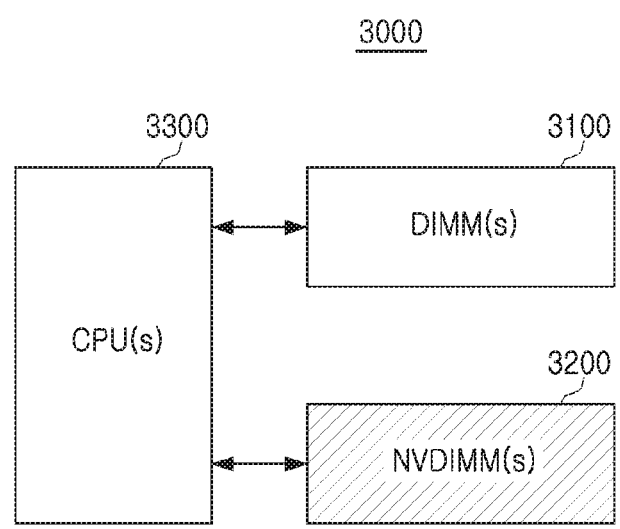
FIG. 28 is a diagram illustrating a server system 3000 according to an example embodiment of the present disclosure.

FIG. 28 is a diagram illustrating a server system 3000 according to an example embodiment of the inventive concept. Referring to FIG. 28, a server system 3000 may include at least one memory module 3100 (DIMM), at least one non-volatile memory module 3200 (NVDIMM), and at least one processor 3300. The at least one non-volatile memory module 3200 may include the non-volatile memory device described in the aforementioned example embodiments. Accordingly, the server system 3000 may increase data reliability through an address scramble, thereby managing data more efficiently.

The example embodiment may also be applied to various types of computing systems (e.g., a central processing unit (CPU)/graphic processing unit (GPU)/neural processing unit (NPU) platform).

Figure 29:
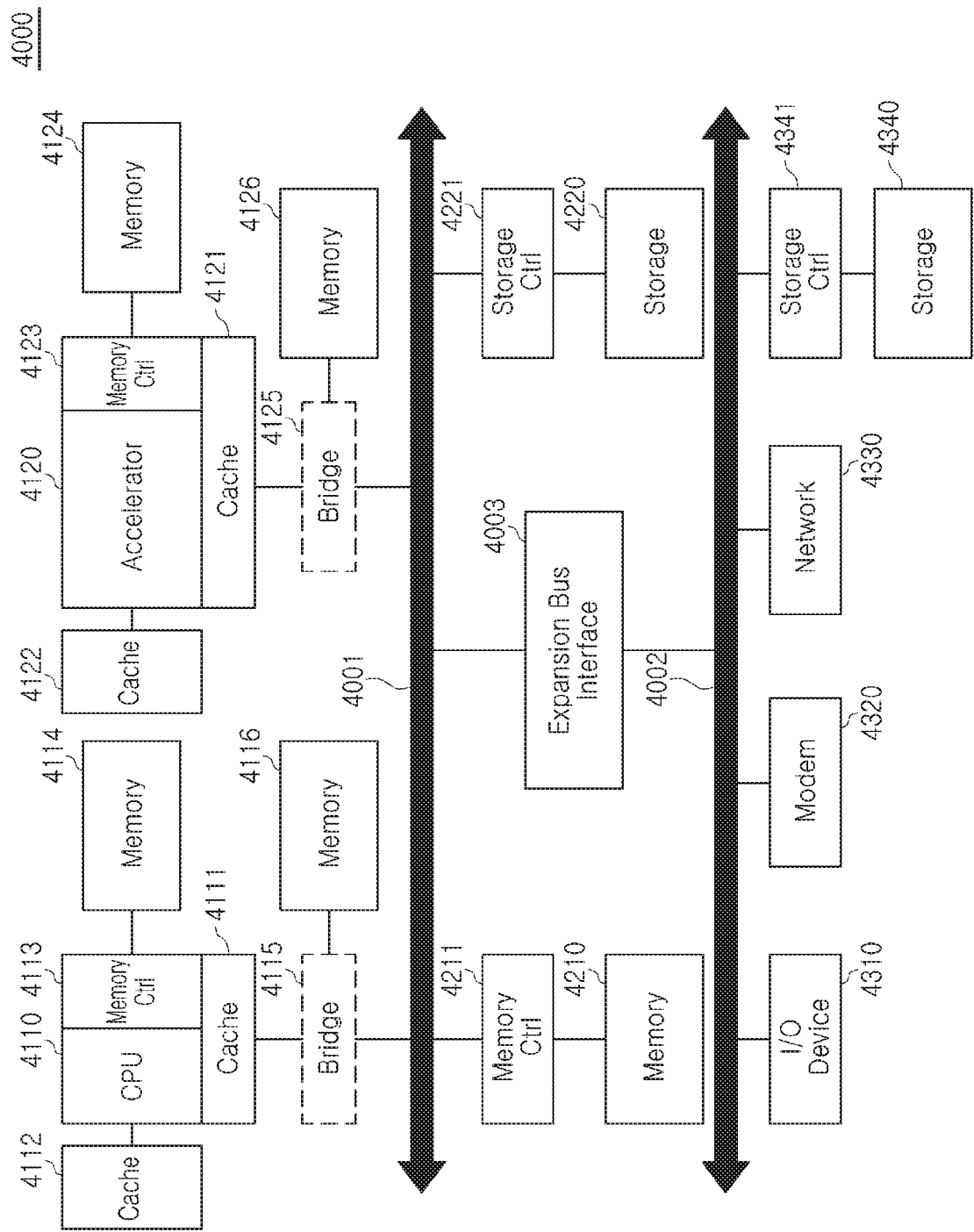
FIG. 29 is a diagram illustrating a computing system 4000 according to an example embodiment of the present disclosure.

FIG. 29 is a diagram illustrating a computing system 4000 according to an example embodiment of the inventive concept. Referring to FIG. 29, a computing system 4000 may include a central processing unit (CPU) 4110, a graphics processing unit (GPU) 4120, or a neural processing unit (NPU); or an application-specific processing unit, connected to system bus 4001, a memory device 4210 or a storage device 4220 connected to the system bus 4001, an input and output device 4310 connected to an extension bus 4002, a modem 4320, a network device 4330, or a storage device 4340. The GPU 4120 may be referred to as an accelerator. The extension bus 4002 may be connected to a system bus 4001 through an extension bus interface 4003.

In the example embodiment, each of the CPU 4110, the GPU 4120, and the NPU 4130 may include on-chip caches 4111, 4121, and 4131.

In the example embodiment, the CPU 4110 may include an off-chip cache 4112. Although not illustrated in FIG. 29, each of the GPU 4120 and the NPU may include an off-chip cache. In the example embodiment, the off-chip cache 4112 may be connected to the CPU 4110, the GPU 4120, and the NPU through different buses.

In the example embodiment, the on-chip/off-chip cache may include a volatile memory such as a dynamic random access memory (DRAM), a static random-access memory (SRAM), or the like, and a non-volatile memory such as a NAND flash memory, a phase-change memory (PRAM), a resistive random access memory (RRAM), or the like.

In the example embodiment, main memories 4114 and 4124 may be connected to the CPU 4110 and the GPU 4120 through corresponding memory controllers 4113 and 4123.

In the example embodiment, memories 4116 and 4126 may be connected to the CPU 4110 and the GPU 4120 through bridges 4115 and 4125. In this case, the bridges 4115 and 4125 may include memory controllers for controlling the corresponding memories 4116 and 4126. In the example embodiment, each of the bridges 4115 and 4125 may be implemented as a network device, a wireless network device, a switch, a bus, a cloud, or an optical channel.

In the example embodiment, memories 4124 and 4126 may include a GPU memory. The GPU memory may maintain a command and data which may interact with a GPU. A command and data may be copied from a main memory or a storage. The GPU memory may store image data, and may have a bandwidth greater than that of a memory. The GPU memory may separate a clock from a CPU. The GPU may read image data from the GPU memory and may process the image data, and may write the image data to the GPU memory. The GPU memory may be configured to accelerate graphics processing.

In the example embodiment, additional memories may be present that may include an NPU memory. The NPU memory may maintain a command and data which may interact with an NPU. A command and data may be copied from a main memory or a storage. The NPU memory may maintain weight data for a neural network. The NPU memory may have a bandwidth greater than that of a memory. The NPU memory may separate a clock from a CPU. The NPU may read weight data from the NPU memory and may update the weight data, and may write the weight data to the NPU memory. The NPU memory may be configured to accelerate machine learning such as a neural network training and inference.

In the example embodiment, each of the main memories 4114, 4116, 4124, and 4126 may be implemented as a memory chip which may perform a read operation to which an address scramble is applied, described in the aforementioned example embodiments with reference to FIGS. 1 to 24.

In the example embodiment, the main memory may include a volatile memory such as a DRAM, a SRAM, or the like, and a non-volatile memory such as a NAND flash memory, a PRAM, a RRAM, or the like. The main memory may have latency and capacity lower than those of secondary storages 4220 and 4340.

The CPU 4110, the GPU 4120, or the NPU may access the secondary storages 4220 and 4340 through the system bus 4001. The memory device 4210 may be controlled by a memory controller 4211. The memory controller 4211 may be connected to the system bus 4001. The storage device 4220 may be controlled by a storage controller 4221. The storage controller 4221 may be connected to the system bus 4001. The storage device 4340 may be controlled by a storage controller 4341. The storage controller 4341 may be connected to the expansion bus 4002.

The storage device 4220 may be implemented to store data. The storage controller 4221 may be implemented to read data from the storage device 4220 and to transmit the read data to a host. The storage controller 4221 may be implemented to store the transmitted data in the storage device 4220 in response to a request from a host. Each of the storage device 4220 and the storage controller 4221 may include a buffer configured to store metadata, to read a cache to store frequently accessed data, or to store a cache for increasing writing efficiency. For example, a write cache may receive and process a certain number of write requests. Also, the storage device 4220 may include a volatile memory such as a hard disk drive (HDD), and a non-volatile memory such as an NVRAM, an SSD, an SCM, and a new memory.

The memory device 100 in the example embodiment may be applied to an automotive system.

Figure 30:
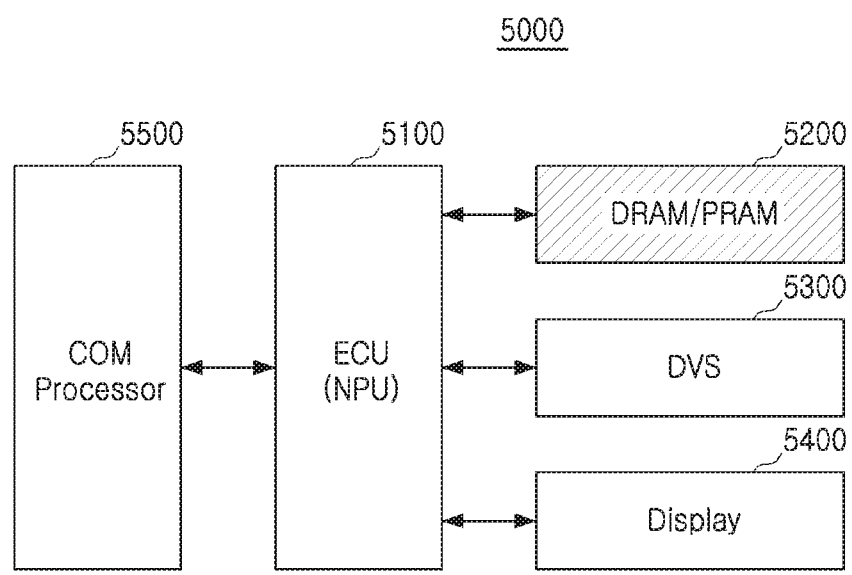
FIG. 30 is a diagram illustrating an electronic system 5000 used for a vehicle according to an example embodiment of the present disclosure.

FIG. 30 is a diagram illustrating an electronic system 5000 used for a vehicle according to an example embodiment of the inventive concept. Referring to FIG. 30, the electronic system 5000 may include an electronic control unit (ECU) 5100, a memory device 5200, at least one dynamic range sensor (DVS) 5300, a display 5400, and a communication processor 5500.

The ECU 5100 may be implemented to control overall operations. The ECU 5100 may process image data received from the DVS 5300. The ECU 5100 may include a neural processing unit (NPU). The NPU may compare an image received from the DVS 5300 with a learning model and may swiftly drive an optimized image for driving.

The memory device 5200 may be implemented to store a learning model related to operation of the NPU. The memory device 5200 may include a volatile or a non-volatile memory device. For example, the memory device 5200 may be implemented by a DRAM or a PRAM. The memory device 5200 may also perform a read operation by an address scramble as described in the aforementioned example embodiments with reference to FIGS. 1 to 24. As an address scramble (or a read scramble) is applied, the memory device 5200 may improve data reliability.

The DVS 5300 may be implemented to sense external environment of a vehicle. The DVS 5300 may output an event signal in response to changes in intensity of relative light. The DVS 5300 may include a pixel array including a plurality of DVS pixels, and address event processors.

The display 5400 may be implemented to display an image processed by the ECU 5100 or an image transmitted by the communication processor 5500.

The communication processor 5500 may be implemented to transmit the processed image to an external device, an external vehicle, for example, or to receive an image from an external vehicle. Accordingly, the communication processor 5500 may be implemented to communicate with an external device in a wired or wireless manner.

The example embodiment may be applied to a mobile device.

Figure 31:
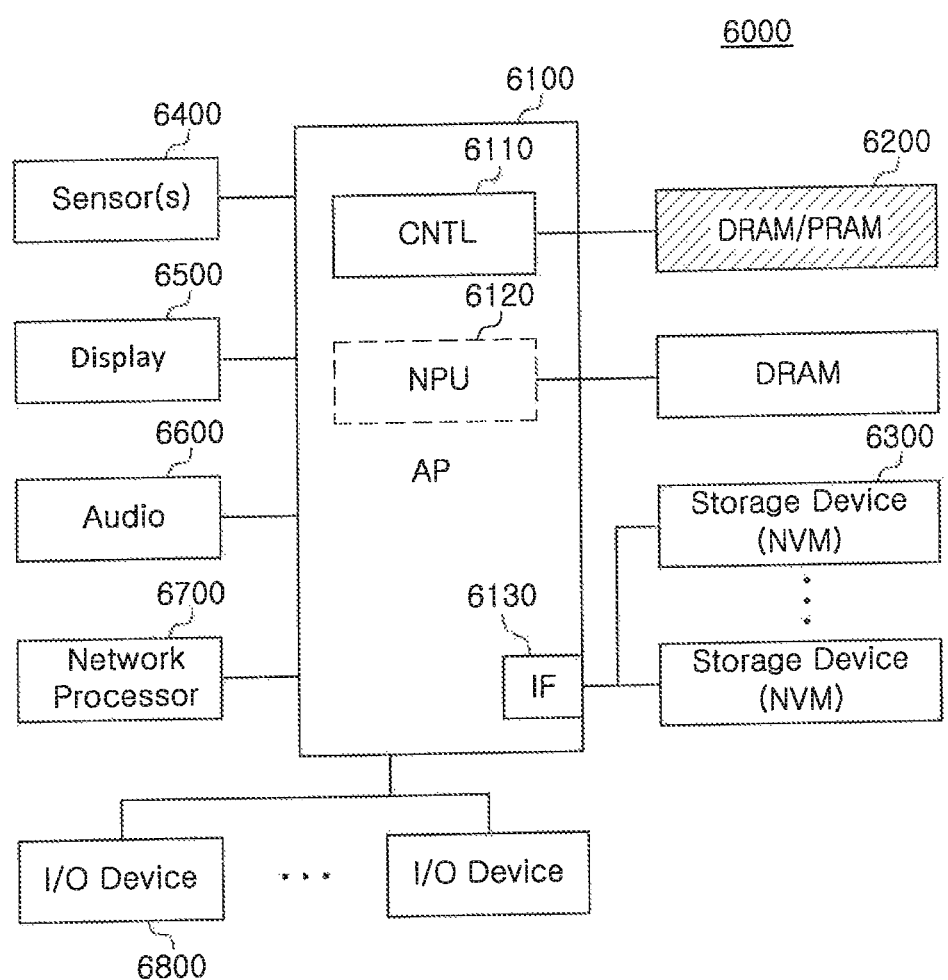
FIG. 31 is a diagram illustrating a mobile device 6000 according to an example embodiment of the present disclosure.

FIG. 31 is a diagram illustrating a mobile device 6000 according to an example embodiment of the inventive concept. Referring to FIG. 31, the mobile device 6000 may include an application processor 6100, at least one DRAM/PRAM 6200, at least one storage device 6300, at least one sensor 6400, a display device 6500, an audio device 6500, a network processor 6600, and at least one input and output device 6700. For example, the mobile device 6000 may be implemented by a laptop computer, a mobile phone, a smartphone, a tablet personal computer (tablet PC), or a wearable computer.

The application processor 6100 may be implemented to control an overall operation of the mobile device 6000. The application processor 6100 may execute applications which provide an internet browser, a game, a video, and the like. In the example embodiment, the application processor 6100 may include a single core or a multi-core. For example, the application processor 6100 may include a multi-core such as a dual-core, a quad-core, and a hexa-core. In the example embodiment, the application processor 6100 may further include a cache memory disposed internally or externally of the application processor 6100. The application processor 6100 may also include a controller 6110, a neural processing unit (NPU) 6120, and an interface 6130. In the example embodiment, the NPU 6120 may be included optionally.

In the example embodiment, the application processor 6100 may be implemented as a system-on-chip (SoC). A kernel of an operating system driven in the SoC may include a device driver for controlling an input and output scheduler and the storage device 6300. The device driver may control access performance of the storage device 6300 or may control a CPU mode, a DVFS level, and the like, of the SoC by referring to the number of synchronized queues managed in an input and output scheduler.

The DRAM/PRAM 6200 may be connected to a controller 6110. The DRAM/PRAM 6200 may store data required for operation of the application processor 6100. For example, the DRAM/PRAM 6200 may temporarily store an operating system (OS) and application data, or may be used as an execution space of various software codes. Also, the DRAM/PRAM 6200 may be connected to the NPU 6120. The DRAM/PRAM 6200 may include the non-volatile memory device which may perform a read operation to which an address scramble is applied, described in the aforementioned example embodiments with reference to FIGS. 1 to 24.

Also, the DRAM/PRAM 6200 may store data related to an artificial intelligence calculation. The DRAM/PRAM 6200 may have latency and bandwidth (BW) faster than those of an I/O device or a flash memory. The DRAM/PRAM 6200 may be initialized in a mobile power-on, and an OS and application data may be loaded and may be used as a temporary storage space of application data, or may be used as an execution space of various software codes. The mobile system may perform a multitasking operation for simultaneously loading various applications, and conversion between applications and an execution speed may be used as a performance index of the mobile system.

The storage device 6300 may be connected to the interface 6130. In the example embodiment, the interface 6130 may operate by one of communication protocols such as DDR, DDR2, DDR3, DDR4, Low Power DDR (LPDDR), universal serial bus (USB), multimedia card (MMC), embedded MMC, peripheral component interconnection (PCI), non-volatile memory express (NVMe), peripheral component interconnect express (PCIe), serial at attachment (SATA), small computer system interface (SCSI), serial attached SCSI (SAS), universal storage bus (USB) attached SCSI (UAS), internet small computer system interface (iSCSI), fiber channel, and fiber channel over Ethernet (FCoE). In the example embodiment, one of the storage devices 6300 may be included and embedded in the mobile device 6000. In another example embodiment, one of the storage devices 6300 may be included in the mobile device 6000 and may be attached and detached from the mobile device 6000.

The storage device 6300 may be implemented to store user data. For example, the storage device 6300 may store data collected from a sensor 6400 or may store data network data, augmented reality (AR)/virtual reality (VR) data, and high definition (HD) 4K content. For example, the storage device 6300 may include a solid state driver (SSD), an embedded multimedia card (eMMC), or the like.

In the example embodiment, the storage device 6300 may be implemented in the application processor 6100 as a separate chip, or may be implemented in a single package with the application processor 6100.

In the example embodiment, the storage device 6300 may be mounted using various forms of packages. For example, the storage device 6300 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), wafer-level processed stack package (WSP), and the like.

The sensor 6300 may be implemented to sense an external environment of the mobile device 6000. In an example embodiment, the sensor 6300 may include an image sensor for sensing an image. In this case, the sensor 6300 may transmit generated image information to the application processor 6100. In another example embodiment, the sensor 6300 may include a bio-sensor for sensing biometric information. For example, the sensor 6300 may sense a fingerprint, an iris pattern, a vascular pattern, heart rates, blood sugar, and the like, and may generate sensing data corresponding to the sensed information. The sensor 6300, however, is not limited to an image sensor or a bio sensor. The sensor 6300 in the example embodiment may include a sensor such as a luminance sensor, an acoustic sensor, an acceleration sensor, and the like.

The display device 6500 may be implemented to output data. For example, the display device 6500 may output image data sensed using the sensor 6300, or may output data calculated using the application processor 6100.

The audio device 6600 may be implemented to externally output voice data, or to sense external voice.

The network processor 6700 may be implemented to connect communication with an external device by a wired or wireless communication method.

The input and output device 6800 may be implemented to input data to the mobile device 6000 or to output data from the mobile device 6000. The input and output device 6800 may include devices providing a digital input and output function such as a universal serial bus (USB) or a storage, a digital camera, an SD card, a touch screen, a DVD, a modem, a network adapter, and so on.

The example embodiment may be applied to a data server system.

Figure 32:
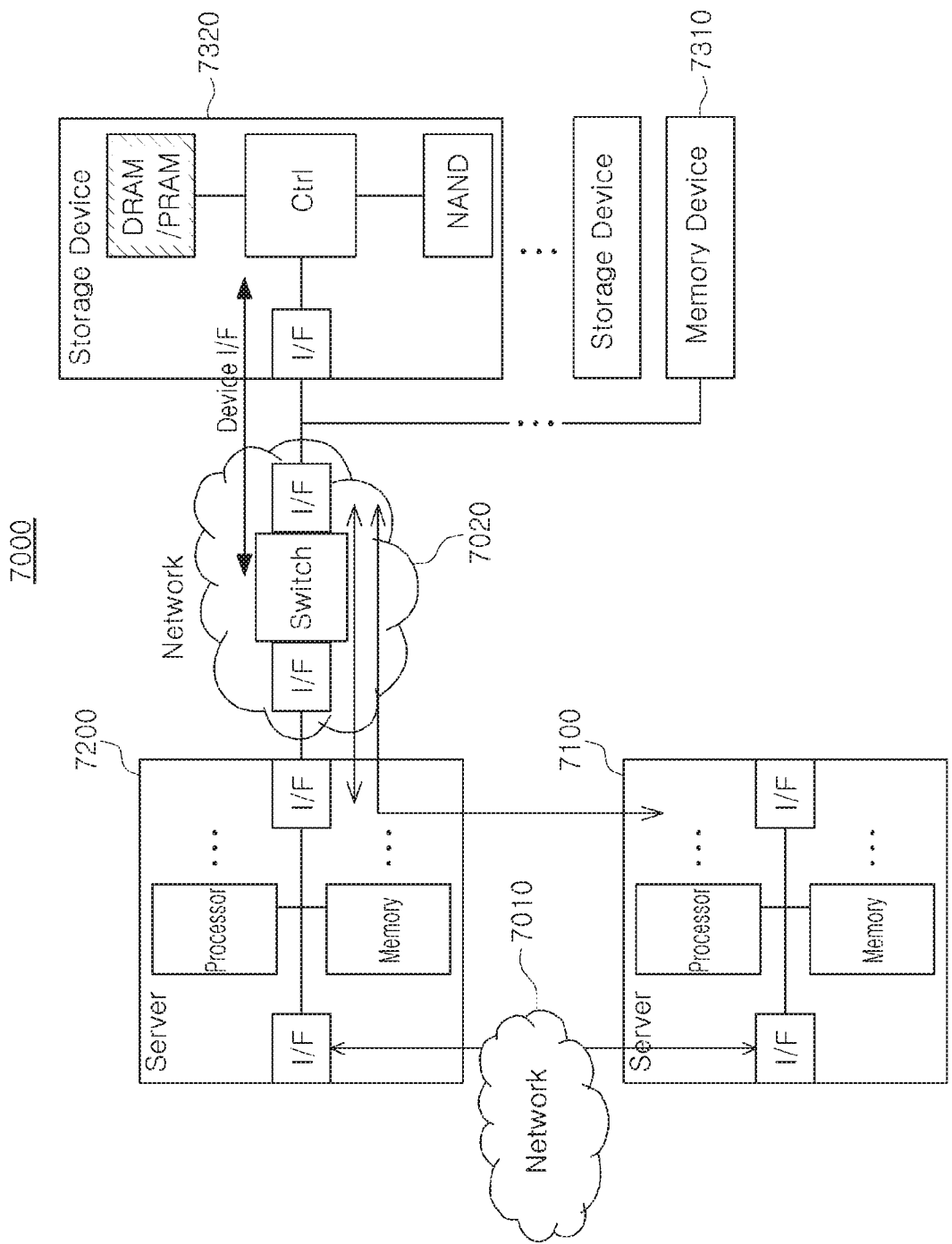
FIG. 32 is a diagram illustrating a data server system 7000 according to an example embodiment of the present disclosure.

FIG. 32 is a diagram illustrating a data server system 7000 according to an example embodiment of the inventive concept. Referring to FIG. 32, the data server system 7000 includes a first server 7100 (an application server), a second server 7200 (a storage server), a memory device 7310, and at least one storage device 7320.

Each of the first server 7100 and the second server 7200 may include at least one processor and a memory. In the example embodiment, each of the first server 7100 and the second server 7200 may be implemented as a pair of memory-processor. In another example embodiment, the first server 7100 and the second server 7200 may include different numbers of processors and memories depending on a usage thereof.

In the example embodiment, the first server 7100 and the second server 7200 may perform communication through a first network 7010. In an example embodiment, each of the first server 7100 and the second server 7200 may access the memory device 7310 through the first network 7010 and/or a second network 7020. In an example embodiment, each of the first server 7100 and the second server 7200 may directly or indirectly access the storage device 7320 through the first network 7010 or the second network 7020.

In an example embodiment, an interface I/F of the storage device 7320 may include SATA, SAS, PCIe, DIMM, high bandwidth memory (HBM), Hybrid Memory Cube (HMC), or NVDIMM. In an example embodiment, the second network 7020 may have a connection from a direct attached storage (DAS) method, a network attached storage (NAS) method, or a storage area network (SAN) method.

In an example embodiment, each of the memory device 7310 and the storage device 7320 may transmit device information to the server 7200 by a command or autonomously. In an example embodiment, the memory device 7310 may include a memory chip to which an address scramble is applied, described in the aforementioned example embodiment with reference to FIGS. 1 to 24.

The data server system 7000 may perform a big-data artificial intelligence calculation. The big data may include a voice, an image, a video, or weight/training data.

According to the aforementioned example embodiments described with reference to FIGS. 1 to 32, an address scramble may be applied to a single memory chip. However, an example embodiment thereof is not limited thereto. The address scramble may also be applied to a plurality of memory chips.

According to the aforementioned example embodiments, by using the non-volatile memory device, a storage device having the same, and a reading method thereof, read levels of tiles may be equalized by applying an address scramble. Accordingly, a read margin may be improve.

Also, by using the non-volatile memory device, a storage device having the same, and a reading method thereof, a yield may improve by distributing error bits caused by a generated word line/bit line bridge using an address scramble.

While example embodiments of the inventive concept have been shown and described above, it will be apparent to those skilled in the art that various modifications can be made without departing from the spirit and scope of the present inventive.

What is claimed is:

1. A non-volatile memory device, comprising:
a memory cell array including a plurality of banks, each bank having a plurality of tiles, each of the plurality of tiles having a plurality of resistive memory cells connected to a plurality of bit lines and a plurality of word lines;
a word line driver configured to select one of the plurality of word lines in response to an input address;
a bit line driver configured to select one of the plurality of bit lines in response to the input address;
a read circuit configured to read a code word from the memory cell array in a read operation;
an error correction circuit configured to correct at least one error of read data using an error correction code included in the code word in the read operation;
a data input and output circuit configured to output the read data or the error corrected data to an external device; and
a control logic configured to control the word line driver, the bit line driver, the read circuit, the error correction circuit, and the data input and output circuit in the read operation,
wherein the control logic performs an address scramble on the input address, and provides the scrambled address to the read circuit to access the plurality of tiles in the read operation.

2. The non-volatile memory device of claim 1, wherein the address scramble is implemented according to a combination of different tiles, different word lines, or different bit lines.

3. The non-volatile memory device of claim 1, wherein memory cells disposed in different corresponding physical positions in tiles are activated in response to addresses of the scrambled address in at least two of the plurality of tiles.

4. The non-volatile memory device of claim 1,
wherein, among the plurality of tiles, a first tile includes a first word line group corresponding to word line numbers sequentially assigned in a direction,
wherein, among the plurality of tiles, a second tile includes a second word line group corresponding to the word line numbers sequentially assigned in the direction from a predetermined position, and a remaining word line group corresponding to a remaining word line number sequentially assigned in the direction.

5. The non-volatile memory device of claim 4, wherein the predetermined position is a central portion of the word lines disposed in the second tile.

6. The non-volatile memory device of claim 1,
wherein, among the plurality of tiles, the first tile includes a first bit line group corresponding to bit line numbers sequentially assigned in a direction, and
wherein, among the plurality of tiles, the second tile includes a second bit line group corresponding to bit line numbers sequentially assigned in the direction from a predetermined position, and a remaining bit line group corresponding to a remaining bit line number sequentially assigned in the direction.

7. The non-volatile memory device of claim 1,
wherein, among the plurality of tiles, the first tile includes a first bit line group corresponding to bit line numbers sequentially assigned in a first direction, and
wherein, among the plurality of tiles, the second tile includes a second bit line group corresponding to bit line numbers sequentially assigned in a second direction opposite to the first direction.

8. The non-volatile memory device of claim 1, further comprising:
a plurality of layers formed in a direction perpendicular to a substrate,
wherein at least one of the plurality of layers includes at least one of the plurality of banks.

9. The non-volatile memory device of claim 1,
wherein the error correction circuit receives write data in a write operation, generates an error correction code corresponding to the received write data, and generates a code word corresponding to the write data and the generated error correction code, and
wherein the non-volatile memory device further includes a write circuit configured to store the generated code word in a plurality of tiles of the memory cell array by applying the scrambled address.

10. The non-volatile memory device of claim 8, wherein at least one of the plurality of layers includes at least one of the word line driver, the bit line driver, the error correction circuit, the read circuit, the write circuit, the data input and output circuit, and the control logic.

11. A non-volatile memory device, comprising:
first tiles; and
second tiles,
wherein each of the first and second tiles includes:
first resistive memory cells formed on a first layer and connected between first word lines and a bit line;
second resistive memory cells formed on a second layer disposed on the first layer, and connected between second word lines and the bit line; and
a peripheral circuit disposed below the first layer, where each of the first word lines, the second word lines, and the bit line are connected to each other by at least one via,
wherein each of the first and second tiles is driven according to an address scramble in a read operation.

12. The non-volatile memory device of claim 11, wherein the first resistive memory cells and the second resistive memory cells are symmetrically positioned with reference to the bit line.

13. The non-volatile memory device of claim 11,
wherein the peripheral circuit includes:
a first row decoder configured to connect the first word lines to each other on a substrate; and
a second row decoder configured to connect the second word lines to each other on the substrate.

14. The non-volatile memory device of claim 11, wherein one bit of data is output to each of the first and second tiles in response to an address in the read operation.

15. The non-volatile memory device of claim 11, wherein a read operation is performed in response to a plurality of addresses in each of the first and second tiles to read a code word.

16. The non-volatile memory device of claim 11, wherein at least two bits of data is output to each of the first and second tiles in response to an address in the read operation.

17. The non-volatile memory device of claim 11, wherein each of the first tiles and the second tiles are classified into a plurality of tile groups, and the read operation is performed in each of the tile groups according to different read levels.

18. A reading method of a non-volatile memory device, the method comprising:
determining a read level according to an address input in a read operation;
performing a read operation using the determined read level to read data;
performing an error correction operation on the read data to generate error-corrected data; and
outputting the error-corrected data to an external device,
wherein the read operation is performed by an address scramble according to a combination of different tiles, different word lines, or different bit lines.

19. The method of claim 18, wherein the read operation retrieves the read data from a memory cell of the non-volatile memory device corresponding to a word line and a bit line selected with a constant interval in response to the same address in the different tiles.

20. The method of claim 18, wherein the non-volatile memory devices includes a plurality of layers formed on a substrate, where each layer includes a plurality of tiles, and the determining of the read level includes determining a read level of a corresponding layer of the plurality of layers according to the input address.

* * * * *